(12) United States Patent
Ukeda

(10) Patent No.: US 9,208,184 B1
(45) Date of Patent: Dec. 8, 2015

(54) SYSTEM DESIGN SUPPORT APPARATUS AND SYSTEM DESIGN SUPPORTING METHOD

(71) Applicant: Hitachi, Ltd., Tokyo (JP)

(72) Inventor: Masaharu Ukeda, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/624,664

(22) Filed: Feb. 18, 2015

(30) Foreign Application Priority Data

Dec. 4, 2014 (JP) ................................. 2014-246189

(51) Int. Cl.
*G06F 17/00* (2006.01)
*G06F 17/30* (2006.01)

(52) U.S. Cl.
CPC ................. *G06F 17/30312* (2013.01)

(58) Field of Classification Search
CPC ...................... G06F 17/30312; G06F 17/30595
USPC .................... 235/375; 717/100, 123
See application file for complete search history.

(56) References Cited

U.S. PATENT DOCUMENTS

| 8,290,931 | B2 * | 10/2012 | Hong et al. | 707/713 |
| 2005/0123891 | A1 * | 6/2005 | Bresciani | 434/322 |
| 2009/0050695 | A1 * | 2/2009 | Ma et al. | 235/382 |
| 2010/0106669 | A1 * | 4/2010 | Guo | 706/11 |
| 2013/0032634 | A1 * | 2/2013 | McKirdy | 235/375 |
| 2014/0366044 | A1 * | 12/2014 | Neeman | 719/318 |

FOREIGN PATENT DOCUMENTS

JP 2008-171318 A 7/2008

* cited by examiner

*Primary Examiner* — Seung Lee
(74) *Attorney, Agent, or Firm* — Volpe and Koenig, P.C.

(57) ABSTRACT

A system design support apparatus identifies design information elements each achieving a corresponding one of multiple requirements concerning a system to be newly designed, by using a first table. When multiple design information elements are identified with respect to a certain one of the requirements as a result of the identification, the system design support apparatus identifies a design information element that establishes a combination at a higher aptitude rank among the multiple design information elements, while referring to an aptitude rank of combined use of each of the multiple design information elements and design information elements identified with respect to another requirement among the multiple requirements, by using a second table. Then, the system design support apparatus outputs the design information elements, which are identified with respect to the multiple requirements, to a predetermined device.

18 Claims, 14 Drawing Sheets

SYSTEM DESIGN SUPPORT APPARATUS AND SYSTEM DESIGN SUPPORTING METHOD

CROSS-REFERENCE TO RELATED APPLICATION

The present application claims the benefit of priority pursuant to 35 U.S.C. §119(a) to Japanese Patent Application No. 2014-246189, filed on Dec. 4, 2014, the entire disclosure of which is hereby incorporated herein by reference.

BACKGROUND OF THE INVENTION

1. Field of the Invention

The present invention relates to a system design support apparatus and a system design supporting method. Specifically, the present invention relates to a technique for proposing a combination of system installation elements, which complies with multiple requirements concerning a system to be installed and enables efficient system design and installation.

2. Related Art

With the advent of cloud computing, IT system design and installation works, which have conventionally been conducted from scratch by humans based on requirements, are replaced with use of patterns which are prepared in units of configurations and can be reused easily. For example, there is provided a service configured to store installed virtual servers and virtual systems as templates and to allow reuse of such templates.

However, when such a pattern is used, it is necessary to verify by humans whether or not the pattern satisfies requirements for a system to be designed and installed, if the requirements on which the pattern is based are not specified by a definite source. System analyses and tests associated with the verification works by humans consume time and effort, and the above-described use of the pattern may rather lead to inefficiency.

In this regard, there has also been proposed a method of forming patterns in units of software components of an OS, software, and the like and combining those patterns as appropriate. As an example of this technique, there has been proposed a software development tool (see Japanese Patent Application Publication No. 2008-171318) which includes: a software structural diagram editor for combining software components stored in a component database to edit a software structural diagram; a software structural diagram analysis part for analyzing software structural diagram data from the editor to generate inter-software component coupling information showing a statistic relation between the components and a dynamic behavior thereof, and extracting a composite component contained in the software structural diagram; a composite component data generation part for generating software component specification data of the composite component; a composite component registration part for registering the software component specification data of the composite component with a database; and a consistency verification part for verifying consistency between the components based on the inter-software component coupling information and the software component specification data stored in the database.

The above-described conventional technique exerts an advantageous effect in the case of a combination of software patterns and unambiguous functional requirements such as software specifications. However, for a target such as an IT system, in which non-functional requirements (e.g., performance, availability, and the like) occupy an important role, the conventional technique does not exert an advantageous effect sufficiently if it is necessary to consider a thing, such as a relation between a software version and system stability, for which a causal relation is difficult to show simply. Furthermore, in an environment such as a cloud environment where the specifications of a service are not disclosed entirely and the software of the service has to be treated as a black box from a user's side, it is necessary to introduce a technique that surpasses the existing software development techniques.

In view of the above, an object of the present invention is to provide a technique for proposing a combination of system installation elements, which complies with multiple requirements concerning a system to be installed and enables efficient system design and installation.

SUMMARY OF THE INVENTION

A system design support apparatus for solving the aforementioned problems includes: a storage device configured to store a first table in which design information elements of a system designed in the past and requirements to be achieved by the design information elements are stored in association with one another, and a second table in which aptitudes of combined use of a plurality of the design information elements included in the first table are managed with aptitude ranks assigned on the basis of track records of the combined use; and a processing unit configured to identify first design information elements achieving a plurality of requirements concerning a system to be newly designed, by using the first table in the storage device, when a plurality of the first design information elements are identified for a first requirement among the plurality of requirements as a result of the identification, to refer, in the second table in the storage device, to the aptitude rank of combined use of each of the plurality of the first design information elements and a design information element identified for a second requirement different from the first requirement among the plurality of requirements, and thereby to identify the first design information element establishing a combination at a higher aptitude rank among the plurality of the first design information elements, and to output the first design information elements thus identified for the plurality of requirements to a predetermined device.

Meanwhile, a system design supporting method to be executed by an information processing apparatus provided with a storage device configured to store a first table in which design information elements on a system designed in the past and requirements to be achieved by the design information elements are stored in association with one another, and a second table in which aptitudes of combined use of a plurality of the design information elements included in the first table are managed with aptitude ranks assigned on the basis of track records of the combined use. The method includes: identifying first design information elements achieving a plurality of requirements concerning a system to be newly designed, by using the first table in the storage device; when a plurality of the first design information elements are identified for a first requirement among the plurality of requirements as a result of the identification, referring, in the second table in the storage device, to an aptitude rank of combined use of each of the plurality of the first design information elements and any of the design information elements identified for a second requirement different from the first requirement among the plurality of requirements, and thereby identifying the first design information element establishing a combination at a higher aptitude rank among the plurality of the first design information elements; and outputting the first design information elements, identified for each of the plurality of requirements to a predetermined device.

According to the present invention, it is possible to propose a combination of system installation elements, which complies with multiple requirements concerning a system to be installed and enables efficient system design and installation.

DETAILED DESCRIPTION OF THE INVENTION

First Embodiment

Figure 1:
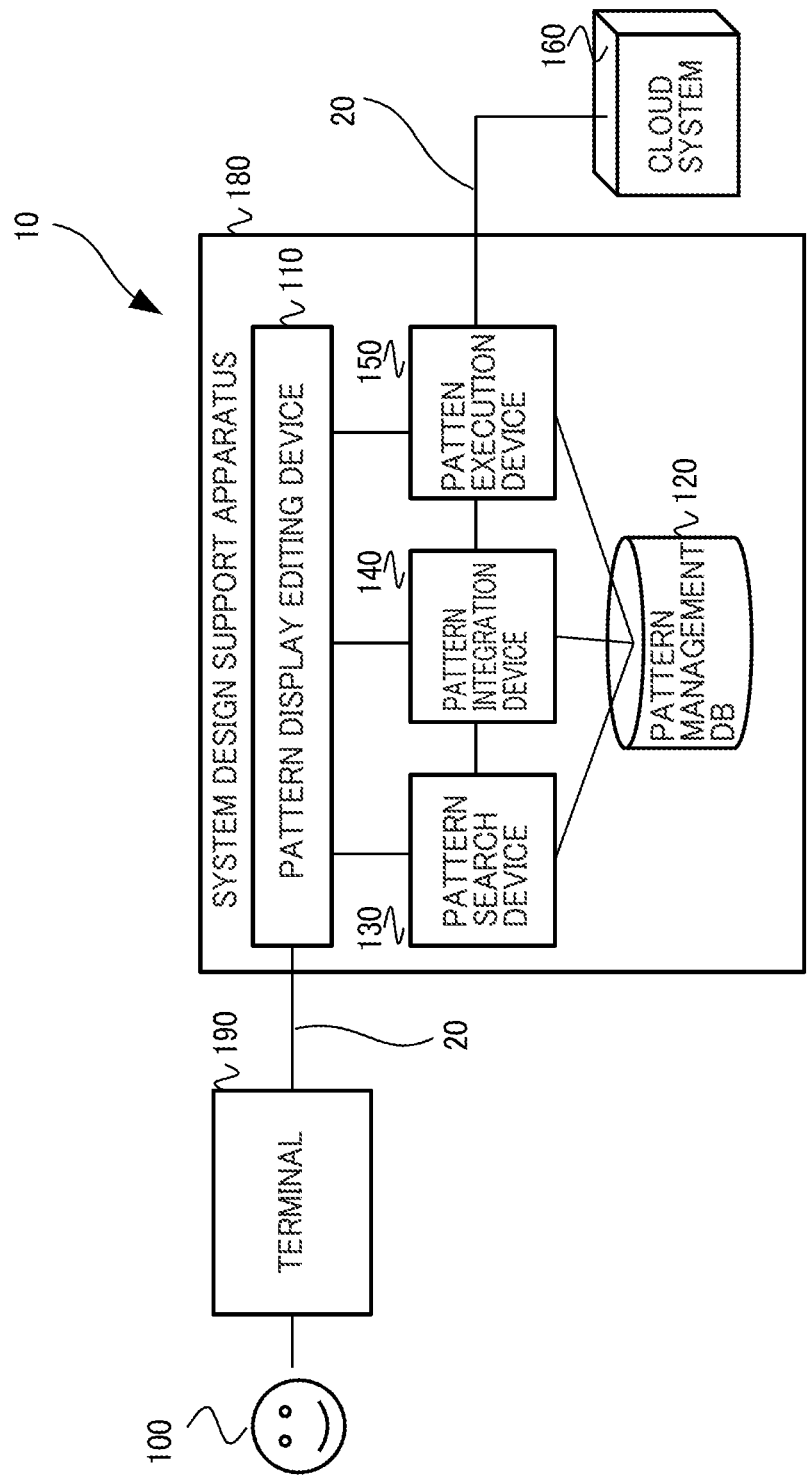
FIG. 1 is a diagram showing an example of a network configuration including a system design support apparatus of a first embodiment.

Embodiments of the present invention will be described below in detail by using the accompanying drawings. FIG. 1 is a diagram showing an example of a network configuration including a system design support apparatus 180 of a first embodiment. The system design support apparatus 180 shown in FIG. 1 is a computer which proposes a combination of system installation elements, which complies with multiple requirements concerning a system to be designed and installed and enables efficient system design and installation. The system design support apparatus 180 of the first embodiment shown as an example in FIG. 1 is communicably coupled to a cloud system 160 and a terminal 190 via an appropriate network 20. Here, among the system design support apparatus 180, the cloud system 160, and the terminal 190, a system design support system 10 may be formed at least from the system design support apparatus 180. In other words, the system design support apparatus 180 is an execution subject of a system design supporting method.

In the configuration shown in FIG. 1, requirements for an IT system to be designed and installed, which are inputted with the terminal 190 by a user 100 such as a system developer, are accepted as an input and appropriately processed by the system design support apparatus 180. Here, the terminal 190 is a computer terminal such as a PC, a tablet terminal, a smartphone, and a mobile telephone, which allows an operator to browse and perform an operation on information provided from a pattern display editing device 110 to be described later.

In the meantime, the system design support apparatus 180 in this configuration selects and combines IT systems (e.g., various servers and the like to be mounted on a cloud service), which are patterned on the basis of design information elements, namely, past design information accumulated in a pattern management database 120, as appropriate in accordance with the above-mentioned requirements, and deploys the IT systems on the cloud system 160.

The above-mentioned cloud system 160 includes server devices and the like which offer cloud services via the Internet. The cloud system 160 offers virtualized functions such as a software function, a platform function, and a hardware function through the network according to the needs of a user. The offered functions include a PaaS (Platform as a Service), a SaaS (Software as a Service), an IaaS (Infrastructure as a Service), and so forth. In the first embodiment, a situation where the cloud system 160 offers, for instance, the PaaS, namely the platform function for execution of various applications including a virtualized WEB server, a virtualized application server, a virtualized database server, and the like through the network, is assumed as an example.

The system design support apparatus 180 in the first embodiment mounts the pattern display editing device 110, a pattern search device 130, a pattern integration device 140, and a pattern execution device 150. While these devices may be realized as hardware, a typical mode assumable is to mount these devices as functions included in the system design support apparatus 180, by way of executing programs provided to the system design support apparatus 180.

Among these devices, the pattern display editing device 110 has functions to provide the above-mentioned terminal 190 with input and output interfaces including GUI (Graphical User Interface), API (Application Programming Interface), CLI (Command Line Interface), and the like, and to accept given input and output operations concerning combinations of requirements and patterns, and the like, via the interfaces. The above-mentioned terminal 190 serves as a terminal which causes the user to execute browsing of and operations using the information via the interfaces provided from the pattern display editing device 110.

Meanwhile, the pattern search device 130 has a function to search the pattern management database 120 for appropriate patterns on the basis of the requirements inputted from the terminal 190.

In the meantime, the pattern integration device 140 has a function, when multiple patterns are identified in terms of a certain one of the requirements as a result of the pattern search conducted by the pattern search device 130 described above, to identify a pattern that achieves a combination at a higher aptitude rank from multiple design information elements by referring to an aptitude rank of combined use of each of the multiple patterns and a pattern identified in terms of another one of the requirements except the certain requirement in a pattern combination table 470 (to be described later) of the pattern management database 120.

Meanwhile, the pattern execution device 150 has functions to determine that the pattern representing a processing result by the pattern search device 130 and the pattern integration device 140 is deployable, and to deploy the pattern on the cloud system 160.

Figure 2:
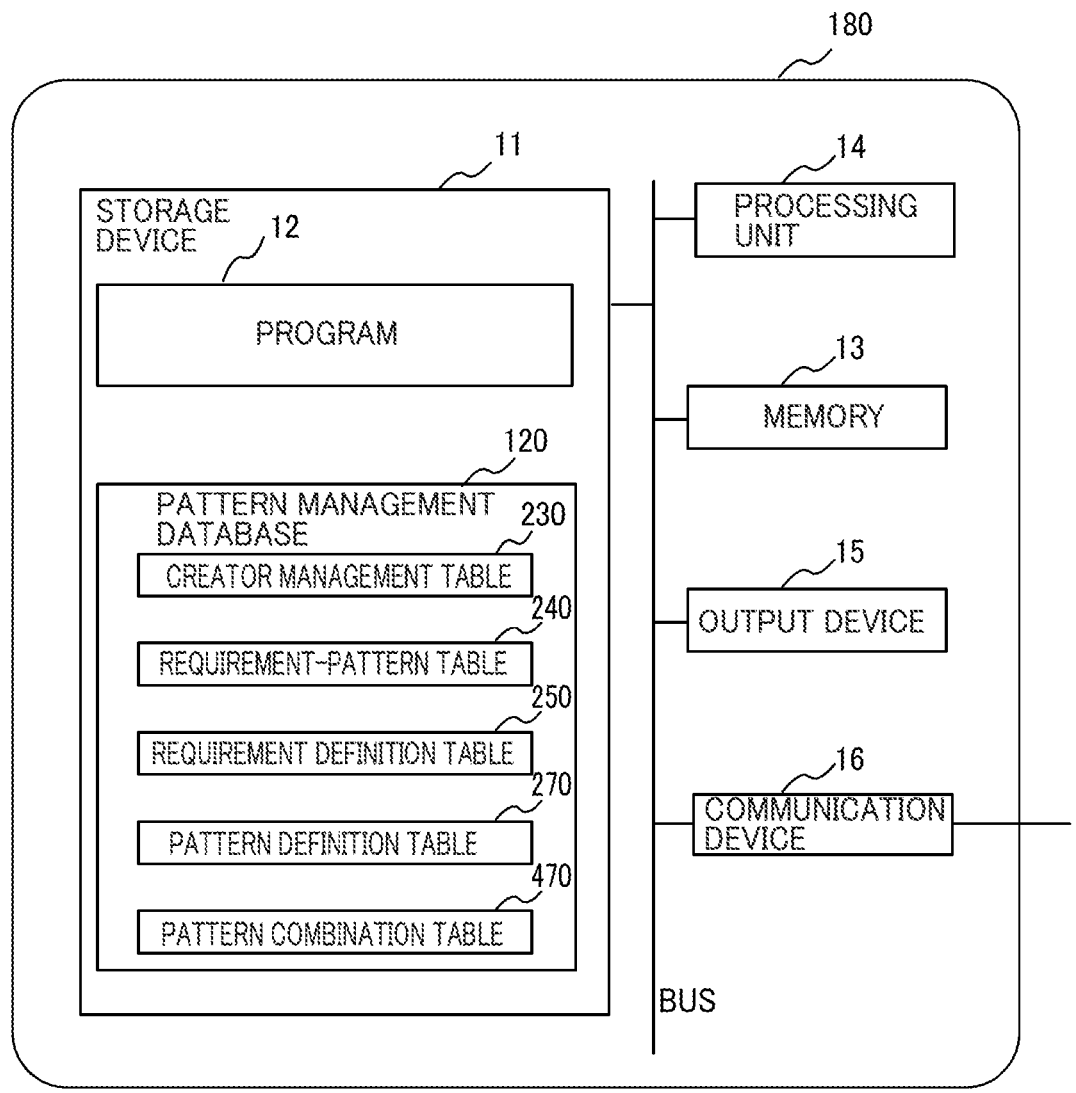
FIG. 2 is a diagram showing an example of a hardware configuration of the system design support apparatus in the first embodiment.

The system design support apparatus 180 that implements the above-described functions has a hardware configuration as shown in FIG. 2. The system design support apparatus 180 in FIG. 2 includes: a storage device 11 formed from an appropriate non-volatile storage element such as an SSD (solid state drive) and a hard disk drive; a memory 13 formed from a volatile storage element such as a RAM; a processing unit 14 such as a CPU, which executes a program 12 held in the storage device 11 by reading the program 12 out to the memory 13 and the like, performs integrated control of the apparatus itself, and performs various judgments, operations, and control processing; an output device 15 such as a display device which displays processing data; and a communication device 16 which is coupled to the network 20 and handles communication processing with other devices. Here, in addition to the program 12 for implementing the functions required as the system design support apparatus of this embodiment, a pattern management database 120 storing a creator management table 230, a requirement-pattern table 240, a requirement definition table 250, a pattern definition table 270, and the pattern combination table 470 is at least stored in the storage device 11. A specific example of a data configuration of this pattern management database 120 will be described later.

Figure 3:
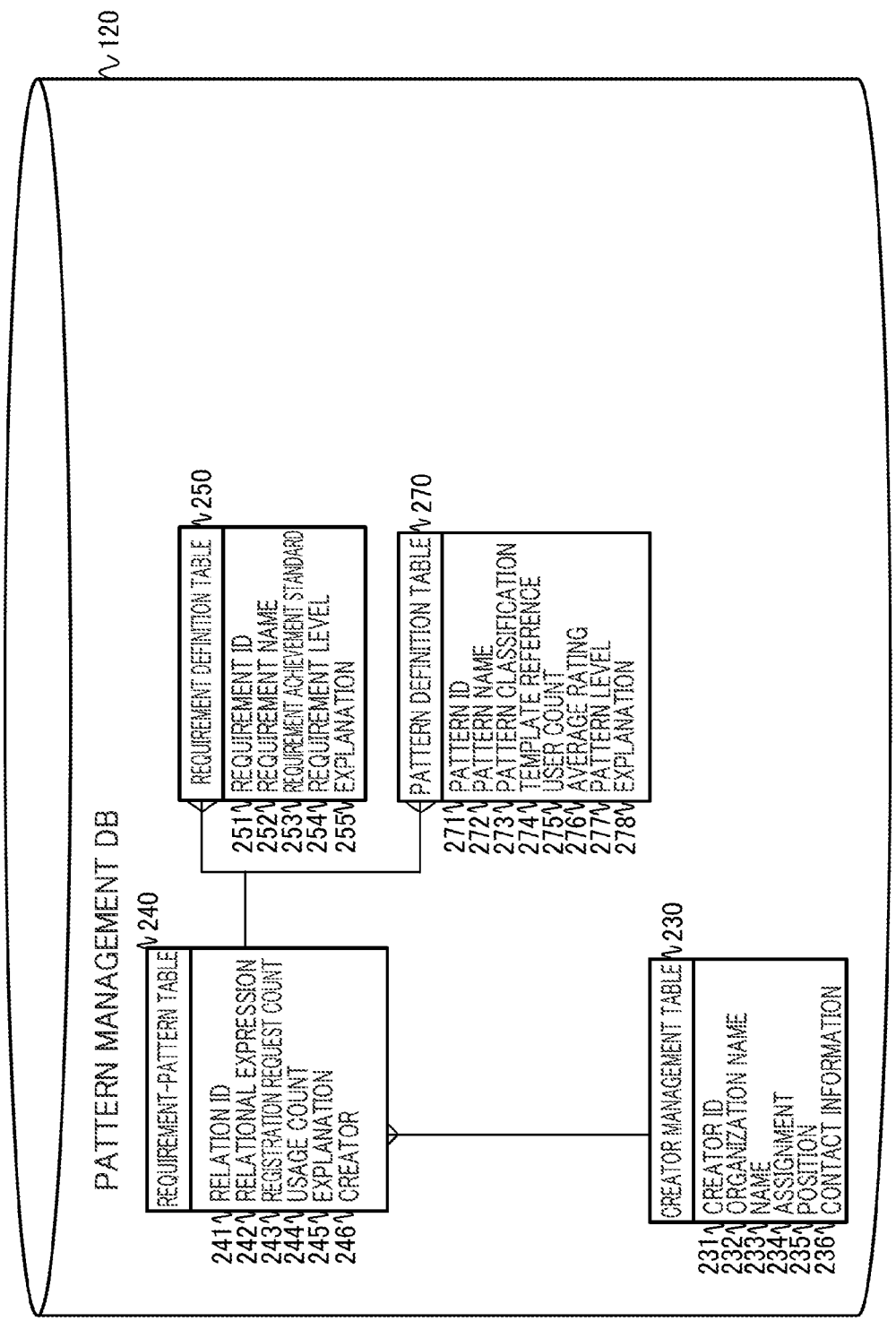
FIG. 3 is a diagram showing a first example of tables included in a pattern management database of the first embodiment.

Next, a specific configuration example of the pattern management database 120 used by the system design support apparatus 180 of the first embodiment will be described. FIG. 3 is a diagram showing a first example of the tables included in the pattern management database 120 of the first embodiment.

The pattern management database 120 shown as the example in FIG. 3 is a database designed to manage information on requirements of IT systems previously designed and installed, and on patterns (hardware, applications, and the like to be mounted on the cloud services) adopted for achieving the requirements. The pattern management database 120 is formed from the following tables. Specifically, the pattern management database 120 includes: the requirement definition table 250 which manages requirements to be registered with the pattern management database 120; the pattern definition table 270 which manages patterns to be registered with the database; the requirement-pattern table 240 which manages relations between the requirements and the patterns mentioned above; and the creator management table 230 which manages creators who register the relations between the requirements and the patterns mentioned above. Besides, the pattern management database 120 also includes the pattern combination table 470, which will be described later.

Among the above-described tables, the requirement definition table 250 is an aggregate of records, where each record uses a requirement ID 251 being an identifier unique to a requirement as a key, and associates values of: a requirement name 252 indicating a defined name of the requirement; a requirement achievement standard 253 representing a benchmark to be satisfied as the requirement; a requirement level 254 indicating a relative achievement standard strictness between requirements; and an explanation 255 indicating a specific explanation of the requirement, with one another.

Among them, the requirement ID 251 and the requirement achievement standard 253 are required values.

Meanwhile, the pattern definition table 270 is an aggregate of records, where each record uses a pattern ID 271 being an identifier unique to a pattern as a key, and associates values of: a pattern name 272 indicating a defined name of the pattern; a pattern classification 273 indicating a category to which the pattern belongs or a granularity of the pattern, such as an OS, a Web server, and a Web three-tier system; a template reference 274 representing an actual condition of the pattern to be deployed on the actual cloud system in relation to the contents registered as the pattern; a user count 275 representing the number of users of the pattern; an average rating 276 representing an average of ratings of the pattern given by the users of the pattern; a pattern level 277 indicating relative quality standard strictness of the pattern; and an explanation 278 which is a specific explanation of the pattern, with one another. Among them, the pattern ID 271, the pattern name 272, the pattern classification 273, the user count 275, the average rating 276, and the pattern level 277 are required values.

In the meantime, the requirement-pattern table 240 is an aggregate of records, where each record uses a relation ID 241 being a unique identifier representing a relation between each requirement registered with the requirement definition table 250 and each pattern registered with the pattern definition table 270 mentioned above as a key, and associates values of: a relational expression 242 indicating a relationship between the requirement and the pattern; a registration request count 243 indicating how many times a registration request corresponding to the combination in the table is issued from the terminal 190; a usage count 244 indicating how many times the relationship is used; an explanation 245 which is a specific explanation of the relation; a creator 246 representing a creator of the relation; and date and time of creation 247 which is date and time when the relation is created, with one another. Among them, the relation ID 241, the relational expression 242, the registration request count 243, and the usage count 244 are required values.

Figure 4:
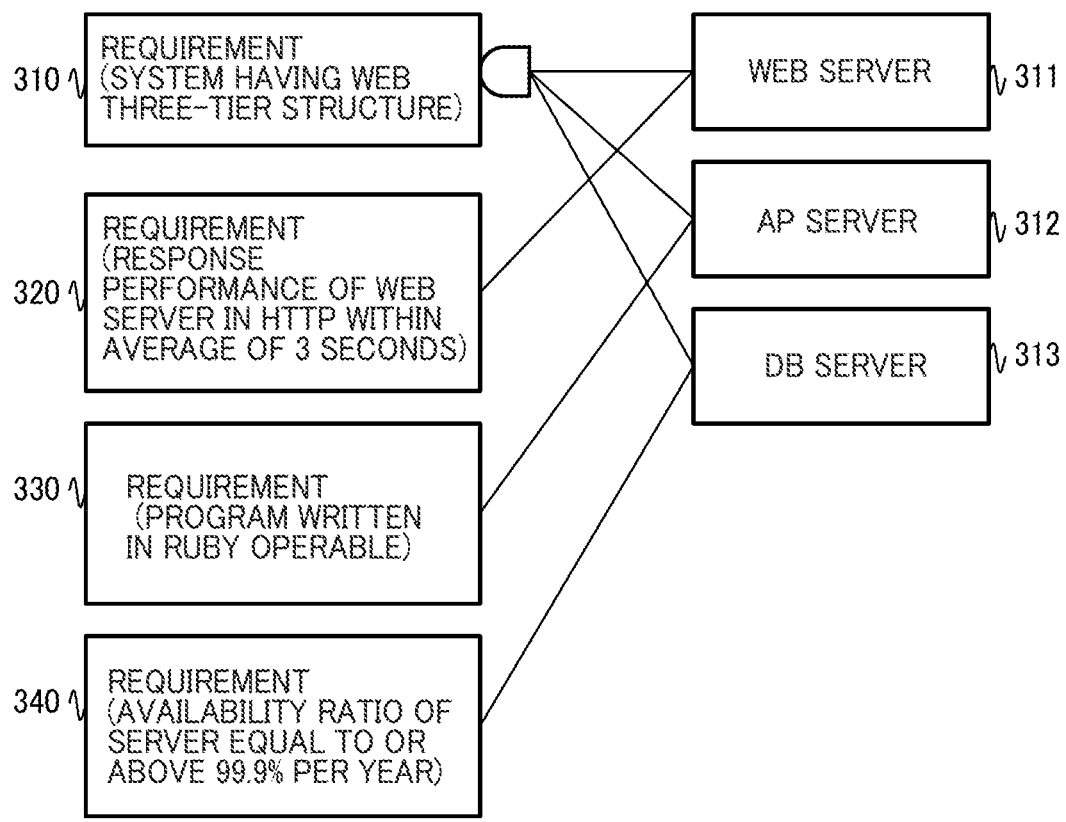
FIG. 4 is a logical relationship diagram showing relations between requirements and patterns in the first embodiment.

An example shown in FIG. 4 can be assumed as a concrete image of the above-mentioned relational expression 242. FIG. 4 is a logical relationship diagram showing relations between the requirements and the patterns in the first embodiment. Here, a requirement 310 is defined as a requirement of a system configuration formed from a Web server, an AP server, and a DB server. A requirement 320 is defined as a requirement concerning a performance of the Web server. A requirement 330 is defined as a requirement of a program processable by the AP server. A requirement 340 is defined as availability of the DB server. In addition, a set of patterns including a pattern 311 corresponding to the Web server, a pattern 312 corresponding to the AP server, and a pattern 313 corresponding to the DB server are assumed to be present as patterns that satisfy all of the requirements 310 to 340.

Based on the above-mentioned premise, the requirement 310 is a combination of the pattern 311, the pattern 312, and the pattern 313. Accordingly, this relation is expressed as "R(310) is satisfied by P(311) and P(312) and P(313)."

Likewise, a relation between the requirement 320 and the pattern 311 can be expressed in the form of "R(320) is satisfied by P(311)."

On the other hand, the pattern 312 has to be the one that meets "P(312) can satisfy R(310) and R(330)." Accordingly, the system design support apparatus 180 selects a pattern that satisfies this condition from the pattern management database 120. In the first embodiment, each set of the requirement and the patterns has been acquired when a certain pattern corresponding to a certain system configuration was confirmed to satisfy a certain requirement on the occasion of system design and installation in the past, and the relationship has been registered with the requirement-pattern table 240 of the pattern management database 120.

Meanwhile, the creator management table 230 is an aggregate of records, where each record uses a creator ID 231 being an identifier unique to a person registering a requirement and a pattern with the pattern management database 120 as a key, and associates values of: an organization name 232 representing an organization to which the creator belongs; a name 233 representing the name of the creator; an assignment 234 representing the creator's assignment to the organization; a position 235 representing the creator's position in the organization; and contact information 236 representing contact information of the creator, with one another. Note that the creator management table 230 is not a part of the essential configuration. However, if the above-described information on the creator (e.g., the assignment, the position, and the like which correlate with experiences and skills) is additionally displayed as information on the person related to the requirements and the patterns included in outputted contents when the system design support apparatus 180 outputs such a result of processing, the information suitably forms the basis for determining appropriateness of the pattern or the combined use thereof.

In the following, actual procedures of a system design supporting method of this embodiment will be described with reference to the drawings. Operations corresponding to the system design supporting method described below are implemented by the program 12, which is read out to the memory 13 and the like and executed by the system design support apparatus 180. Moreover, the program 12 includes codes for performing various operations to be described below.

Figure 5:
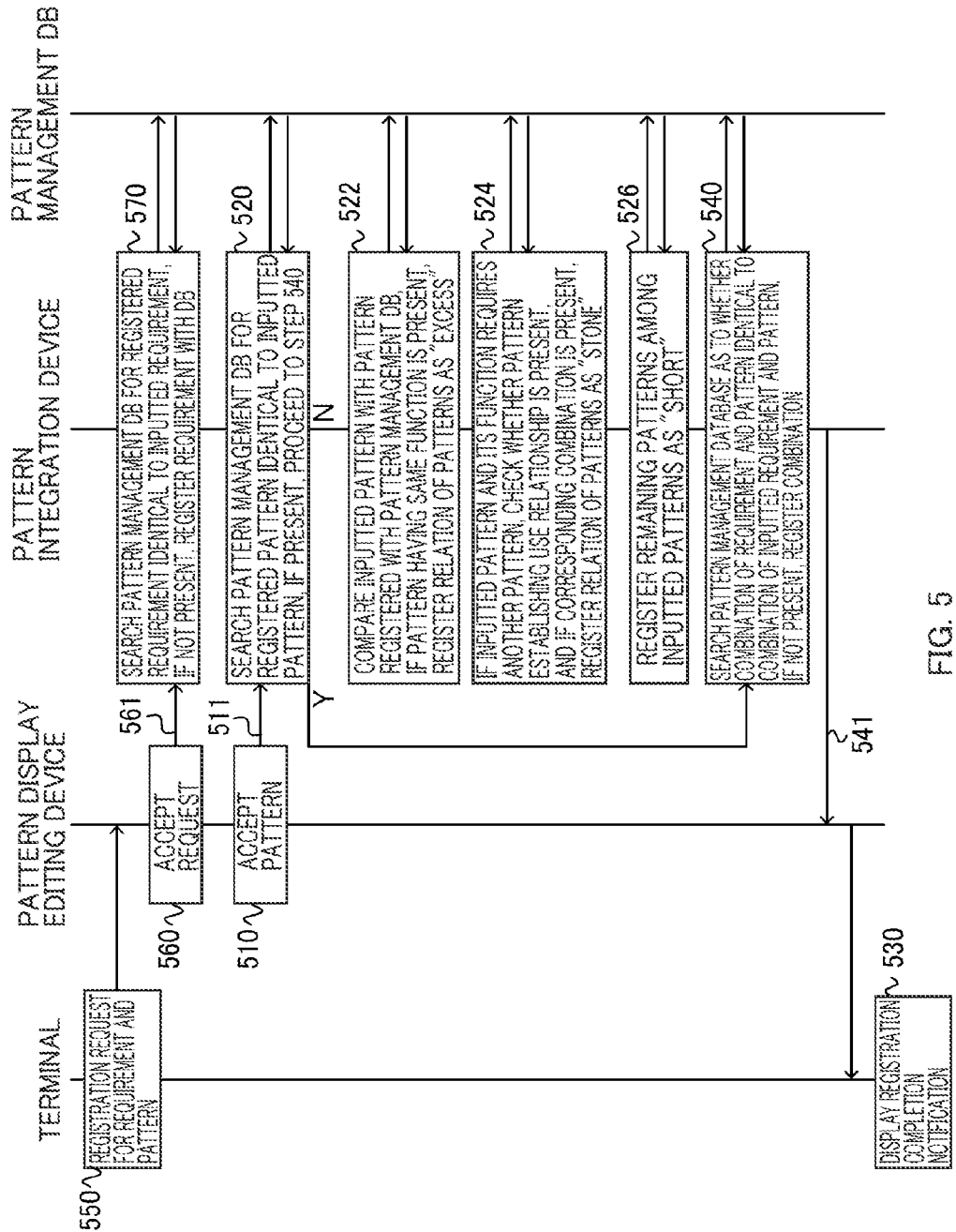
FIG. 5 is a flowchart showing a first procedural example of a system design supporting method of the first embodiment.

FIG. 5 is a flowchart showing a first procedural example of the system design supporting method of this embodiment. Specifically, FIG. 5 is a flowchart concerning processing for registering a requirement and a pattern with the pattern management database 120.

Here, it is assumed that the user 100, who wishes to register information on a requirement and a pattern concerning an IT system already designed and installed, operates the terminal 190 to access the system design support apparatus 180, thereby starting registration processing.

In this case, the above-mentioned terminal 190 accepts an input of the set of the requirement and the pattern by the user 100 through the input device, and transmits a registration request including the accepted information to the system design support apparatus 180 via the network 20 (step 550).

Meanwhile, the pattern display editing device 110 of the system design support apparatus 180 accepts the requirement and the pattern indicated in the above-mentioned registration request (steps 560, 510) via the appropriate interfaces and the like provided to the terminal 190, and notifies the pattern integration device 140 of the requirement and the pattern (steps 561, 511).

In this case, the pattern integration device 140 executes a search in the pattern management database 120 by using the requirement notified from the above-mentioned pattern display editing device 110 as a key. When an identical requirement that has already been registered is not present, the pattern integration device 140 registers the requirement with the requirement definition table 250 of the pattern management database 120 (step 570). Likewise, the pattern integration device 140 executes a search in the pattern management database 120 by using the pattern notified from the above-mentioned pattern display editing device 110 as a key. The processing proceeds to step 522 when an identical pattern that has already been registered is present (step 520: Y). On the other hand, the processing proceeds to step 540 when the identical pattern that has already been registered is not present (step 520: N).

Here, if there are no restrictions regarding a method of describing the set of the requirement and the pattern to be accepted from the user 100 by the terminal 190, a search performance concerning the information after the registration with the pattern management database 120 is deteriorated. For this reason, as described in reference to the steps 570 and 520 above, the pattern integration device 140, which executes the registration processing of the requirement on the basis of the above-mentioned registration request, is preferably configured to perform the searches as to whether or not the same or similar requirement and pattern have already been registered with the pattern management database 120 so as to avoid duplicate registration of the same requirement and pattern with the pattern management database 120. Of this processing, the registration processing of the requirement (the above-described step 570) will be cited as an example, and details of the example will be shown below on the basis of FIG. 6.

Figure 6:
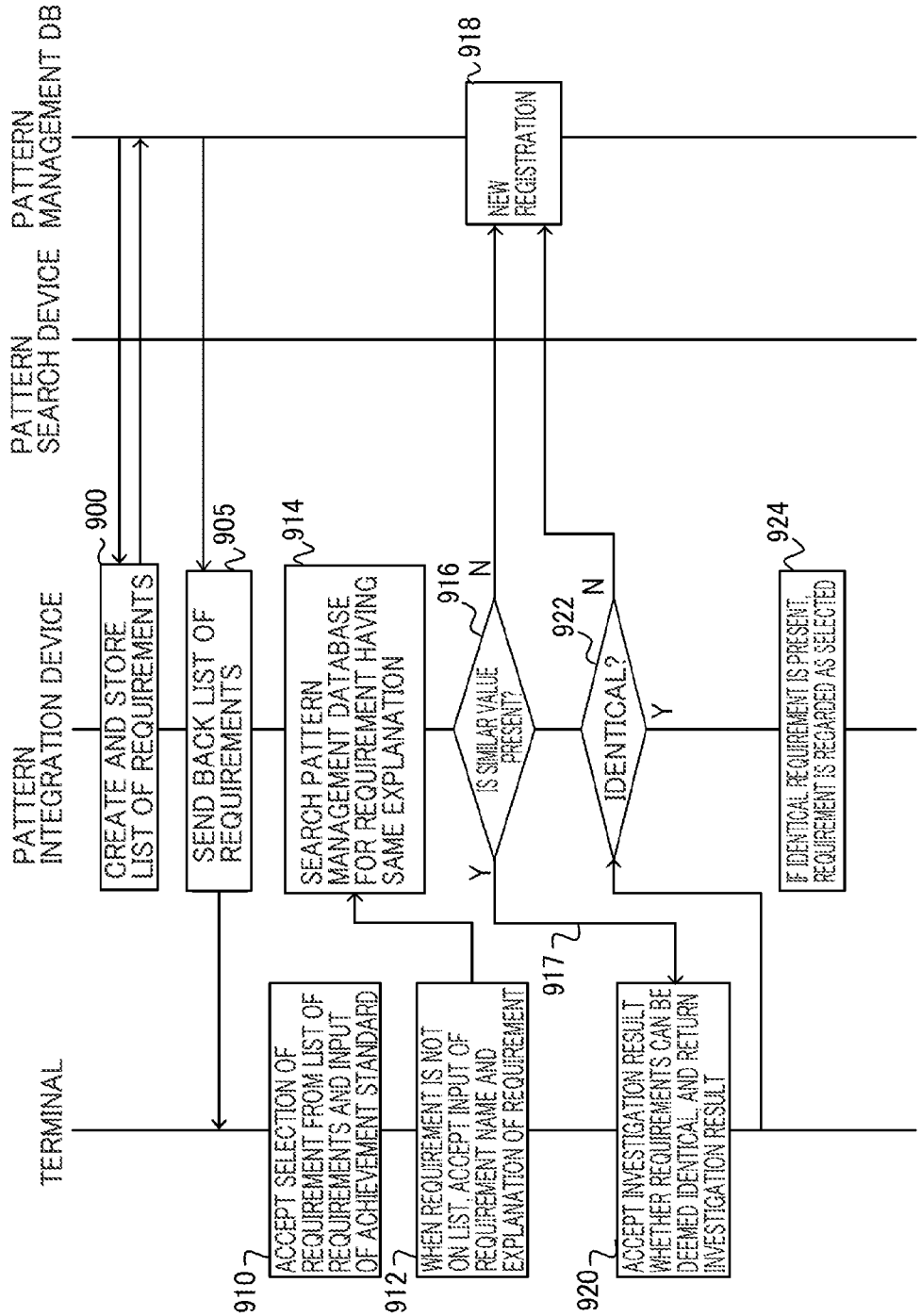
FIG. 6 is a flowchart showing a second procedural example of the system design supporting method of the first embodiment.

FIG. 6 is a flowchart showing a second procedural example of the system design supporting method of this embodiment. Specifically, FIG. 6 is a flowchart showing details of the registration of the requirement (step 570). Here, it is assumed that requirements associated with several patterns have already been registered with the pattern management database 120. Moreover, it is also assumed that the pattern integration device 140, for instance, has created a list of registered requirements in the requirement-pattern table 240 of the pattern management database 120 and the storage device 11 holds the list (step 900).

In this situation, the registration request including the information on the requirement and the pattern is transmitted from the terminal 190 to the pattern display editing device 110. Having accepted the registration request, the pattern integration device 140 reads the list of requirements held in the above-mentioned step 900 from the storage device 11, and sends the list back to the terminal 190 for display (step 905). Here, the exchange of the information between the terminal 190 and the pattern integration device 140 is supposed to be relayed by the pattern display editing device 110. However, for the sake of simplifying the descriptions, the relay processing by the pattern display editing device 110 will be omitted in the following descriptions (the same applies hereinafter).

In the meantime, the terminal 190 displays the above-mentioned list of requirements on an output device to make the list available for inspection by the user 100. The user 100 checks whether or not the list of requirements includes the requirement that the user 100 wishes to register. If the appropriate requirement is present in the list, the user 100 inputs an achievement standard of the requirement by using the terminal 190. At this time, the terminal 190 accepts a value of the achievement standard concerning the requirement designated by the user 100 (step 910). For example, if the requirement that the user 100 wishes to register is a "response performance by the Web server to a HTTP request," then an "average within 3 seconds" or the like corresponds to the achievement standard. Accordingly, the user 100 in this case selects and inputs the "average within 3 seconds" representing the achievement standard by using the terminal 190. The pattern integration device 140 preferably causes the terminal 190 to additionally display a selection list for the achievement standard corresponding to the requirement depending on a selection event of the requirement from the above-mentioned list of requirements. In this case, the user 100 selects the achievement standard from the selection list by using the terminal 190.

On the other hand, if the requirement that the user 100 wishes to register is not present in the above-mentioned list of requirements, the user 100 inputs the requirement name and explanation of the requirement by using the terminal 190. The terminal 190 accepts the input concerning the requirement name and the explanation of the requirement and transmits the requirement name and the explanation of the requirement to the pattern integration device 140 (step 912).

The pattern integration 140 in this case accepts the above-mentioned information on the requirement name and the explanation of the requirement and searches the pattern management database 120, thereby checking whether or not the requirement having the same explanation has been registered (step 914). The way of the above-described search inclusive of the explanation of the requirement as the key deals with an intention to check whether or not the requirement has actually been registered with and present in the pattern management database 120 on the basis of the explanation of the requirement in the case where it is difficult to identify the requirement on the basis of the requirement name alone. For instance, in the above described example, it is assumed that the requirement envisaged by the user 100 as the one that the user 100 wishes to register is a "service level concerning an inquiry of the Web server" and its achievement standard is an "average HTTP response within 3 seconds." Meanwhile, if the requirement definition table 250 of the pattern management database 120 registers the "average within 3 seconds" as the value of the requirement achievement standard 253 or the explanation 255 concerning the requirement which is the "response performance by the Web server to a HTTP request," then the value is deemed to be almost equivalent to the achievement standard intended by the user 100.

If a similar value is present (step 916: Y) as a result of the above-described check, the pattern integration device 140 sends the terminal 190 a notification to seek confirmation by the user 100 (step 917). On the other hand, if such a similar value is not present (step 916: N), the pattern integration device 140 executes the registration of the appropriate requirement with the pattern management database 120 as a new requirement (step 918).

Having received the notification seeking the above-mentioned confirmation, the terminal 190 displays the notification on the display device and causes the user 100 to view the notification. The user 100 investigates whether or not the requirement presented by the pattern integration device 140 is identical to the requirement intended by the user 100, and inputs a result of investigation by using the terminal 190. In this case, the terminal 190 accepts the result of investigation by the user 100 and sends the result back to the pattern integration device 140 (step 920).

Having received the result, the pattern integration device 140 executes registration (step 918) of the appropriate requirement with the pattern management database 120 as the new requirement if the result of investigation represents "not identical" (step 922: N). On the other hand, when the result of the investigation represents "identical" (step 922: Y), the pattern integration device 140 selects the appropriate requirement from the list of requirements (step 924), and terminates the flow.

Now, the description goes back to the flow of FIG. 5. Subsequent to the above-described registration of the requirement (steps 560 to 570), the pattern integration device 140 executes the registration processing of the pattern received from the above-mentioned pattern display editing device 110 (step 520). In step 520, the pattern integration device 140 searches the pattern management database 120 for the pattern inputted through the terminal 190, thereby checking whether or not the same pattern as the inputted pattern has been registered with the pattern management database 120.

Figure 7:
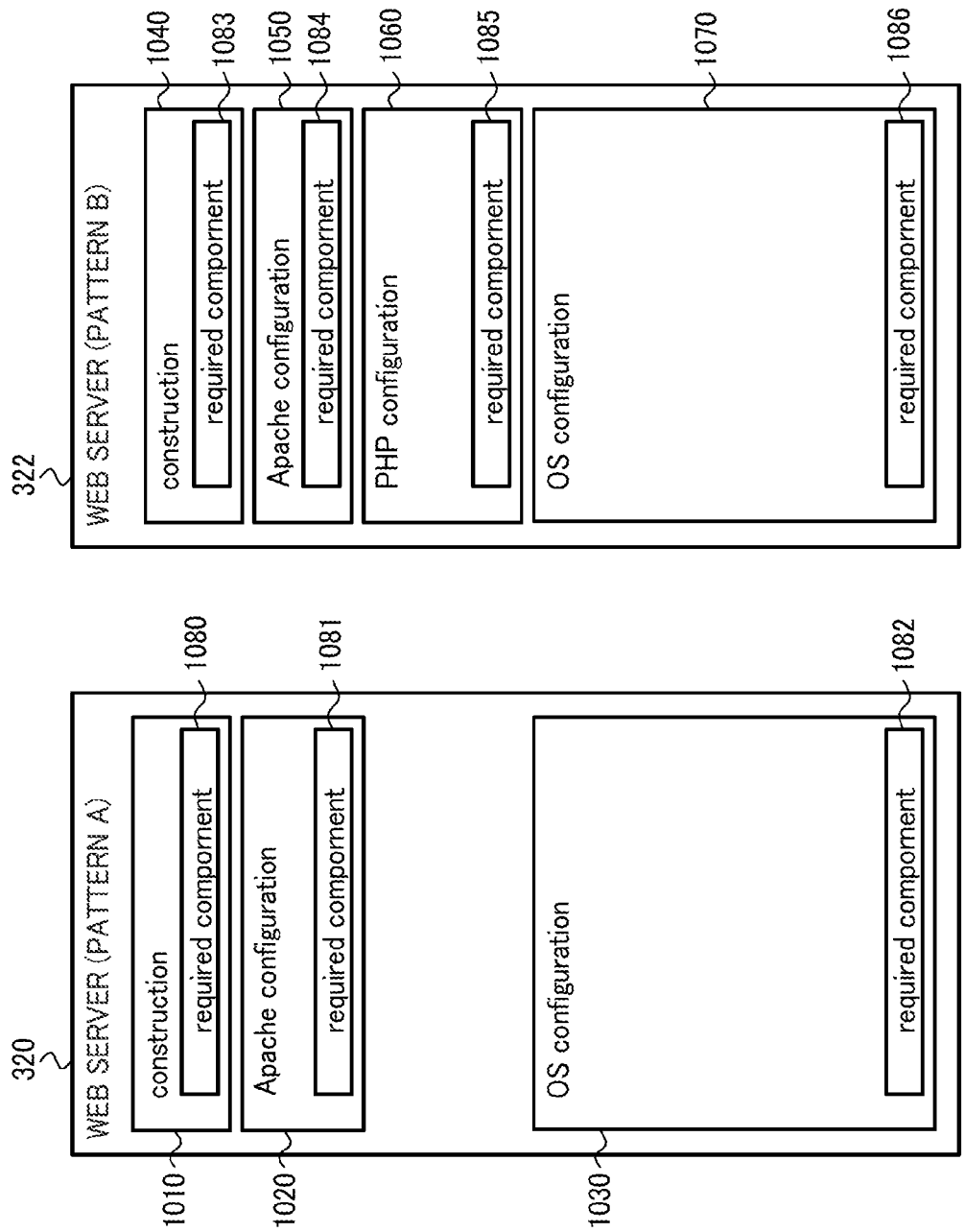
FIG. 7 is a diagram showing a configuration example of patterns in the first embodiment.

Here, concrete images of patterns to be registered (or which are registered) with the pattern management database 120 are demonstrated. FIG. 7 is a diagram showing a configuration example of patterns in the first embodiment. Both of a pattern 320 and a pattern 330 shown as examples in FIG. 7 are patterns compatible with the configuration of the Web server. For example, the pattern 320 configures the Web server in which Apache (registered trademark) is installed on its OS, and includes: a construction 1010 representing a relation of a part which is a constituent of the pattern; an Apache configuration 1020 representing a setting of Apache installed thereon; and an OS configuration 1030 representing a setting of the OS. Here, required components 1080, 1081, and 1082 respectively contained in the construction 1010, the Apache configuration 1020, and the OS configuration 1030 each indicate a precondition of a part required by the corresponding constituent. For example, the required component 1082 is the precondition of the OS, and therefore includes such a definition as to which hypervisor, which network configuration, or which operation is supposed to be a destination of a deployment of this pattern.

Meanwhile, the pattern 322 is similar to the above-described pattern 320, but further includes a PHP configuration 1060 representing a setting of a PHP which is mounted for a function to dynamically create a Web page.

Each of the required components contained in the patterns 320 and 322 may be classified into necessity levels as the precondition, such as MUST (which means 'absolutely necessary') and OPTIONAL (which means 'may be provided'). Each of the patterns cited herein may employ an arbitrary method of description as long as the method applies a computer-processable language such as XML and YAML, because a difference in the method of description does not affect advantageous effects of the present invention. In the meantime, as the method of describing the patterns, it is only necessary to employ a method which is capable of defining types of parts including the OS and the software as well as describing settings thereof, and similarly defining types concerning relations of the parts as well as describing setting thereof. TOSCA which is an OASIS standard, OVF which is a DMTF standard, or the like corresponds to such a description method.

Identity between the patterns, such as the pattern 320 and the pattern 322 shown as the examples in FIG. 7, is checked in the above-described processing in step 520. Here, the expression "identical patterns" is equivalent to the fact that an identical IT system can be reproduced when the contents defined by the pattern are mounted on the cloud service. Accordingly, if there is a single different part or parameter when the patterns are compared to each other, then the same IT system cannot be reproduced by mounting the patterns respectively. Hence, the patterns are not deemed identical in this case. When the patterns 320 and 322 shown as the examples in FIG. 7 are compared to each other, the two patterns are deemed to be not identical because of the presence of the PH configuration 1060. Needless to say, differences between the contents of the required components respectively contained in the patterns 320 and 322 also constitute criteria for determining the identity. Nevertheless, if the required parts are different only in the order of description whereas the contents thereof are the same, then the patterns are deemed to be identical since these patterns reproduce the same IT system (provided that there is no restriction which depends on the order of description).

As a result of the above-described step 520, when it is determined that the identical pattern is not present in the pattern management database 120 (step 520: N), the pattern integration device 140 proceeds the processing to step 522 and executes processing for new registration of the pattern. In this embodiment, there is a case where a use relationship exists between the patterns. Accordingly, by managing track records of not only the patterns alone but also combinations of the patterns establishing the use relationships, it is possible to reduce test man-hours when the system is designed and installed by combining multiple patterns. This is based on the fact that a large amount of man-hours are required in association with design changes and updates of parts without conducting the management at a granularity increased to some extent when reusability and maintainability of the parts are taken into consideration. For example, an update of an OS occurs in the case of a pattern including the OS, DB software, and Web server software, the entirety of the pattern has to be reviewed. Accordingly, if there is another pattern in which only the Web server software is different, it is difficult to apply a result of review of the OS and the DB software included in the former pattern because these patterns are different from each other. In this embodiment, however, when increasing the granularity in terms of the pair of the OS and the DB, the pair of the OS and the Web server, and so forth, then it is possible to rate the relations between the parts as the track records. Accordingly, if there is a certain pattern having a high rating as a track record concerning the relation between the updated OS and the DB, then it is easier to review a complicated pattern by applying the setting of the certain pattern thereto.

In step 522, the pattern integration device 140 compares the inputted pattern with the patterns in the pattern management database 120. When the pattern management database 120 includes the pattern having the same functional blocks, the pattern integration device 140 defines the relation between these patterns as "excess" and registers the relation with the pattern combination table 470 (to be described later) of the pattern management database 120 (step 522). Here, the expression "having the same functional blocks" means having the constituents (the parts) of the same type definition. For example, a pattern including the OS, the Web server, and the DB and a pattern including the OS and the Web server both have the same functional blocks, namely, the "OS" and the "Web server." Hence, the relation between these patterns is registered as "excess" with the pattern combination table 470. For example, if two patterns having a use relationship with regards to the requirements for a certain IT system share the same functional blocks, or in other words, when the relation between the patterns is defined as "excess," there is a risk of causing trouble or inefficiency at the time of mounting, which is attributed to a contradiction or a functional overlap between the patterns.

The pattern integration device 140 performs the confirmation processing in the above-described step 522 in a similar manner concerning other patterns received from the terminal 190. Then, the pattern integration device 140 checks whether the inputted pattern and each of the patterns in the pattern management database 120 can be coupled to each other, or in other words, whether the patterns establish a use relationship. When the patterns can be coupled to each other, the relation between the patterns is defined as "stone" which is registered with the pattern combination table 470 (step 524). The determination as to whether the patterns "can be coupled to each other" is made on the basis of whether a required component contained in any of the patterns enables coupling between one of the patterns and the other pattern, or whether the required component requires such coupling.

The pattern integration device 140 performs the confirmation processing in the above-described step 524 in a similar manner concerning other patterns received from the terminal 190. Then, the pattern integration device 140 registers the remaining patterns among the inputted patterns as "short" with the pattern combination table 470 (step 526). However, when an increase in the number of the patterns is anticipated and there is a need to reduce the data size of the pattern management database 120, the pairs of the patterns without definitions of relationships may be regarded as "short." The definition "short" indicates a relation of the patterns which cannot be directly coupled to each other, i.e., a relation which cannot directly establish the use relationship. For example, a pattern including the Web server or an application execution framework (such as Java and php) needs to be interposed between the patterns of the OS and a Web application. In this case, the patterns are regarded as not directly linking each other.

Subsequently, the pattern integration device 140 executes a search for a combination in the pattern management database 120 which is identical to the combination of the inputted requirement and pattern. If there is not the identical pattern therein, the pattern integration device 140 registers the combination with the requirement-pattern table 240 of the pattern management database 120, as a new relationship between the requirement and the pattern. After completion of the above-described series of processing, the pattern integration device 140 returns a registration completion notification to the terminal 190 (step 541). In the meantime, the terminal 190 receives this registration completion notification and displays the registration completion notification on the display device (step 530), and then terminates the processing.

Figure 8:
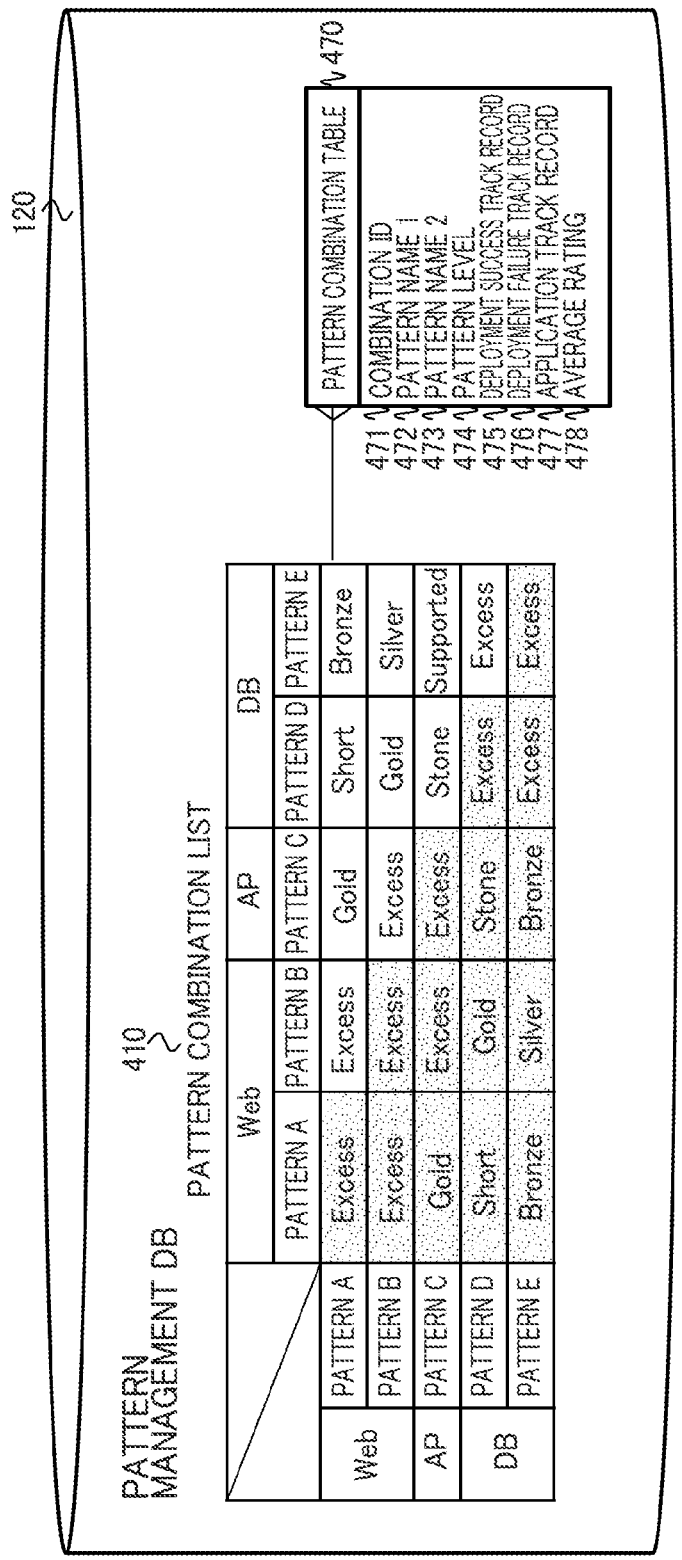
FIG. 8 is a diagram showing a second example of tables included in the pattern management database of the first embodiment.

FIG. 8 shows a specific example of the pattern combination table 470 including the values concerning the relationships of the pairs of patterns registered as described above. FIG. 8 shows examples of the pattern combination table 470 managed by the pattern management database 120, and a pattern combination list 410 based on the pattern combination table 470. Of the tables, the pattern combination table 470 includes: a combination ID 471 which is a unique identifier representing a combination of the patterns; a pattern name 472 representing the original pattern to be combined; a pattern name 473 representing the counterpart pattern to be combined; a pattern level 474 representing a pattern benchmark calculated by using the pattern names 472 and 473; a deployment success track record 475 which is incremented when a deployment based on the patterns succeeds; a deployment failure track record 476 which is incremented when the deployment fails; an application track record 477 indicating how many times the combination is used by users; and an average rating 478 which is the rating when the deployment succeeds.

Figure 9:
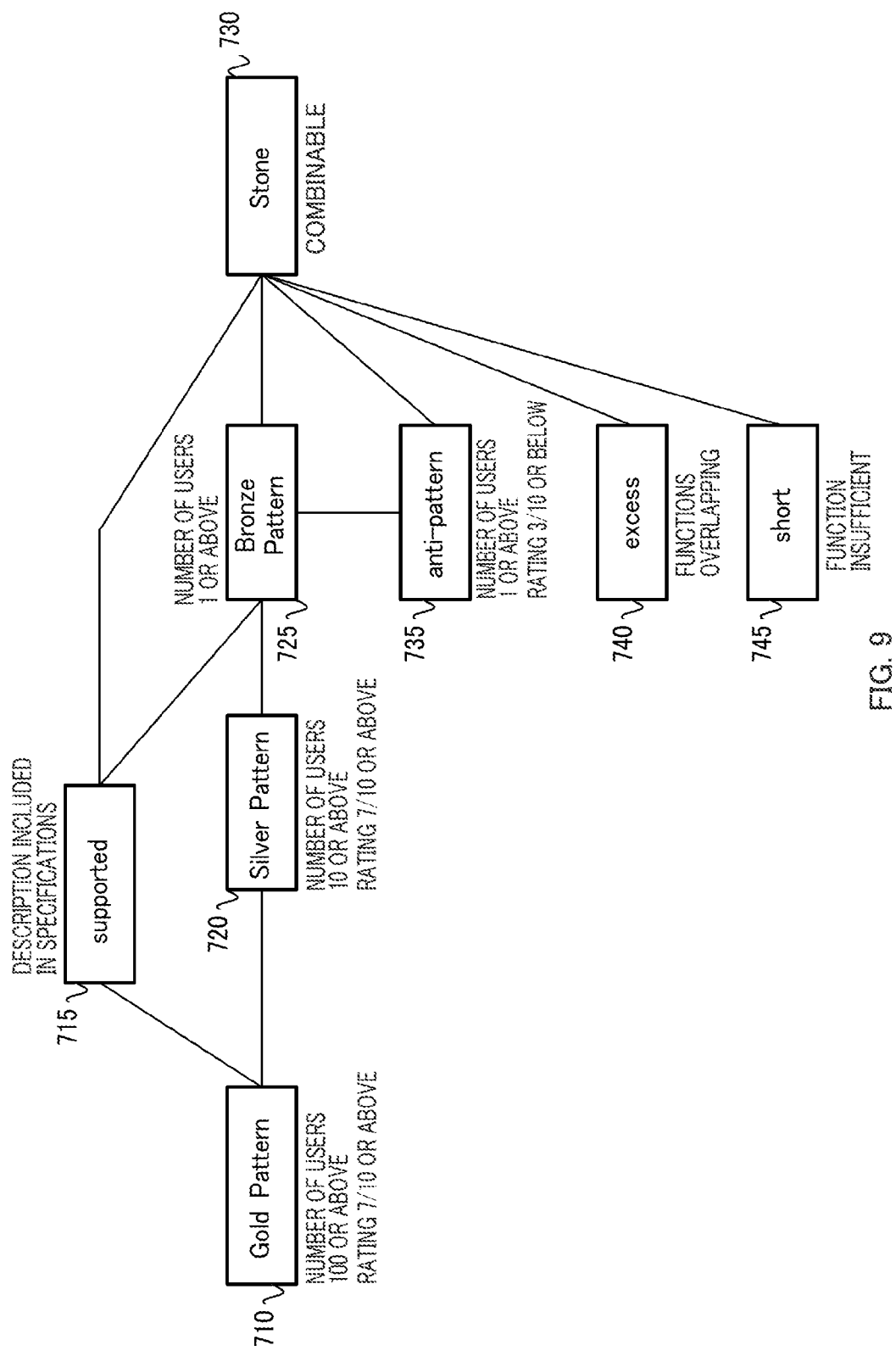
FIG. 9 is a relationship diagram showing relations of track records provided to combinations of patterns in the first embodiment.

Relations among the patterns can be expressed as shown in the pattern combination list 410 by using the pattern name 472, the pattern name 473, and the application track record 477 described above, as well as the pattern classification 273 described in the pattern definition table 270. Characters including "excess," "gold," and the like described in this matrix each represent the corresponding application track record 477 described above. A specific configuration of the application track records is as shown in FIG. 9. FIG. 9 illustrates relations among eight types of the application track records. The application track records shown as the example in FIG. 9 includes: a "stone" 730 representing that the combination of the corresponding patterns turns out to be possible in light of the specifications thereof; a "bronze pattern" 723 corresponding to a track record indicating that at least one user succeeds in the deployment and operation; a "silver pattern" 720 having ten or more users and acquiring high ratings; and a "gold pattern" 710 having a hundred or more users and acquiring high ratings. In the meantime, a "supported pattern" 715 means that the combination is assured by a provider of the patterns irrespective of the number of users. Meanwhile, an "anti-pattern" 735 represents a combination of the patterns which is described in the specifications but is actually infeasible. Moreover, the aforementioned "excess" 740 and the "short" 745 are also included in this category. By using the above-described pattern combination list 410, it is possible to check whether or not one pattern and another pattern can be used in combination.

Next, a description will be provided for processing to perform identification of a pattern which achieves each requirement, and identification of a pattern in accordance with an aptitude of combined use of patterns when multiple patterns are identified with respect to a certain requirement, in accordance with the system design supporting method of this embodiment and on the basis of the requirements of an IT system to be designed and installed.

Figure 10:
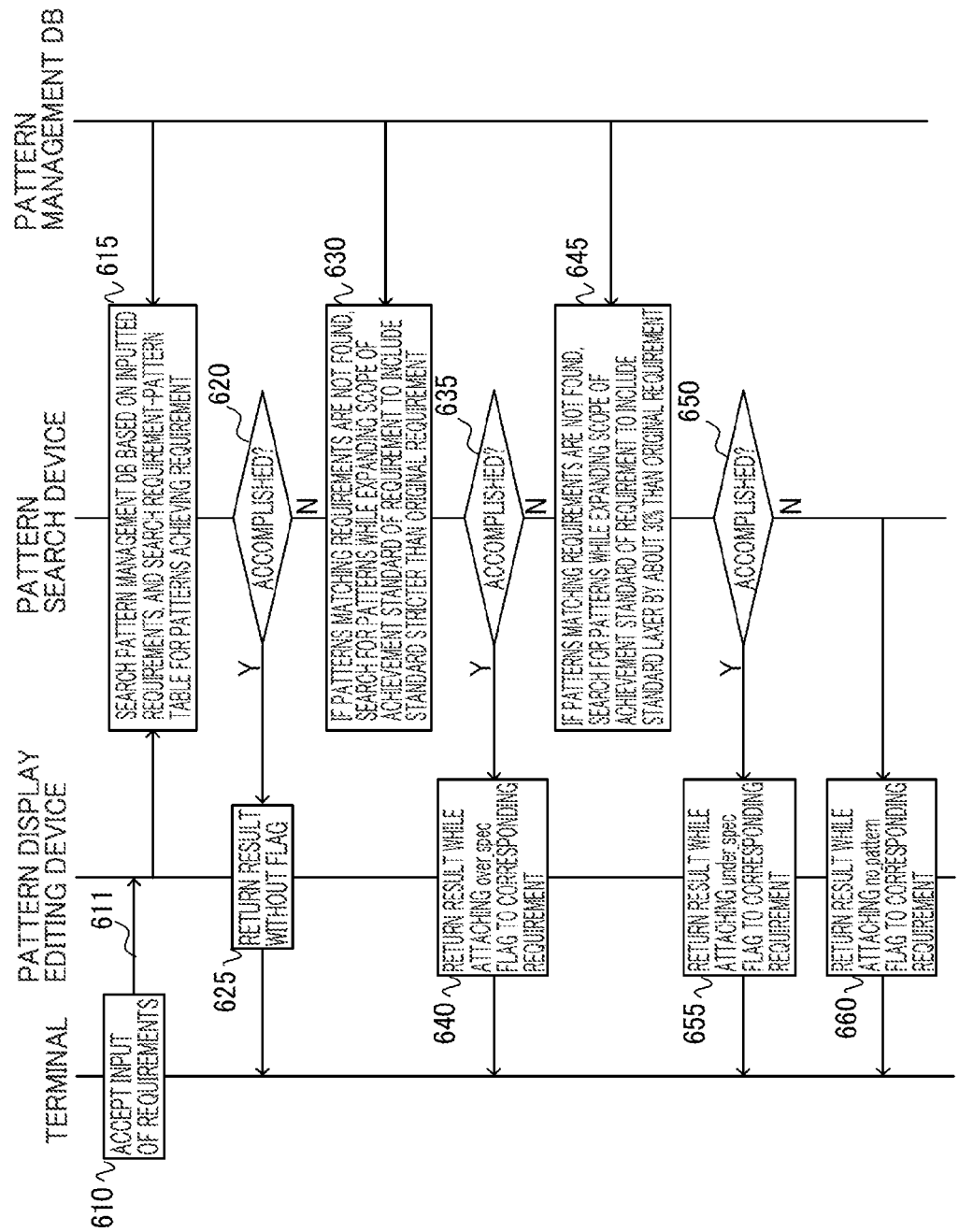
FIG. 10 is a flowchart showing a third procedural example of the system design supporting method of the first embodiment.

FIG. 10 is a flowchart showing a third procedural example of the system design supporting method of this embodiment. Specifically, FIG. 10 is a flowchart showing details of processing for selecting a pattern in response to an input of a requirement. In this case, the user 100 who intends to design and install a new IT system inputs the requirements of the new system to be designed and installed by using the terminal 190. Here, the terminal 190 accepts the input of the requirements (step 610), and transmits the accepted requirements to the pattern search device 130 via the pattern display editing device 110 (step 611).

Having accepted the requirements, the pattern search device 130 searches the pattern management database 120 based on the requirements inputted through the terminal 190, thereby searching the requirement-pattern table 240 for the patterns that achieve the requirements (step 615). As a result of the search, when a set of the patterns satisfying all the requirements designated by the terminal 190 is found (step 620: Y), the pattern search device 130 returns information on the patterns identified in the above-described search to the terminal 190 without attaching any flag to the information (step 625), and suggests the appropriate patterns to the user 100.

On the other hand, as a result of the above-described search in step 615, if a pattern which achieves any of the requirements inputted by the terminal 190 is not successfully searched, or if any of the requirements is not satisfied (step 620: N), the pattern search device 130 searches the requirement-pattern table 240 again by expanding the scope of the achievement standard to the extent including a standard stricter than the corresponding achievement standard of the requirement inputted by the terminal 190 (step 630). For example, if an achievement standard of one of the requirements inputted by the terminal 190 concerns a processing speed and defines an "average response speed equal to or below 3 seconds," then the pattern search device 130 searches the requirement-pattern table 240 for a pattern including one which achieves a higher processing speed than the "average response speed equal to or below 3 seconds" (e.g., an average response speed equal to or below 1 second).

As a result of this search, when a set of the patterns satisfying all the requirements designated by the terminal 190 is found (step 635: Y), the pattern search device 130 returns the newly identified patterns as a consequence of tightening (the achievement standards of) the requirement in the above-described step 630, to the terminal 190 while attaching a flag "over spec" thereto (step 640), and suggests the appropriate patterns to the user 100.

On the other hand, as a result of the search, if any of the requirements designated by the terminal 190 is not satisfied (step 635: N), the pattern search device 130 searches the requirement-pattern table 240 again by including patterns which achieve a standard laxer by a certain degree (e.g., having a value laxer by 30%) than the corresponding achievement standard of the requirement inputted by the terminal 190 (step 645). For example, if the achievement standard of one of the requirements inputted by the terminal 190 concerns the processing speed and defines the "average response speed equal to or below 3 seconds," then the pattern search device 130 searches the requirement-pattern table 240 for a pattern including one which achieves a lower processing speed than the "average response speed equal to or below 3 seconds" (e.g., an average response speed equal to or below 5 seconds).

As a result of this search, when a set of the patterns satisfying all the requirements designated by the terminal 190 is found (step 650: Y), the pattern search device 130 returns the newly identified patterns as a consequence of loosening (the achievement standard of) the requirement in the above-described step 630, to the terminal 190 while attaching a flag "under_spec" thereto (step 655), and suggests the appropriate patterns to the user 100.

On the other hand, as a result of the search, if any of the requirements designated by the terminal 190 is not yet satisfied (step 650: N) even after loosening its achievement standard, the pattern search device 130 returns the corresponding requirement to the terminal 190 while attaching a flag "no pattern" thereto (step 660). Then, the pattern search device 130 terminates the processing.

Here, as for an arrangement sequence of the patterns identified in the above-described steps 615, 630, and 645 (e.g., an arrangement sequence of display positions of the patterns in the information to be returned from the pattern search device 130 to the terminal 190), a pattern having a smaller difference from the achievement standard (which is inputted by the terminal 190) of one of the requirements, or a pattern having a higher track record has a priority. Here, the arrangement sequences of the patterns are defined by the following expressions.

*When the requirements and the patterns inputted by the terminal 190 coincide with those searched in the requirement-pattern table 240:

$$\text{Arrangement sequence point} = \text{the track record of the pattern} \quad \text{(Expression 1500)}.$$

*When the pattern having the achievement standard stricter than that of the requirement inputted by the terminal 190 is identified:

$$\text{Arrangement sequence point} = \text{the track record of the pattern} - (|\text{the achievement standard of the requested requirement} - \text{the achievement standard of the requirement associated with the identified pattern}|/\text{the achievement standard of the requested requirement})^{1/2} \quad \text{(Expression 1510)}.$$

*When the pattern having the achievement standard laxer than that of the requirement inputted by the terminal 190 is identified:

$$\text{Arrangement sequence point} = \text{the track record of the pattern} - |\text{the achievement standard of the requested requirement} - \text{the achievement standard of the requirement associated with the pattern}|/ \text{the achievement standard of the requested requirement} \quad \text{(Expression 1520)}.$$

Here, the track record of the pattern is rated by defining gold=1.3, supported=1.0, silver=0.7, bronze=0.5, stone=0.2, excess=0.1, and other=0, for example. These computational expressions and the point allotment may be changed depending on a system which applies the computational expressions and the point allotment.

After recognizing the patterns identified by the search on the terminal 190, the user 100 executes the deployment by actually combining the patterns, thereby installing a desired IT system on the cloud service. The processing associated with the deployment will be described below.

Figure 11:
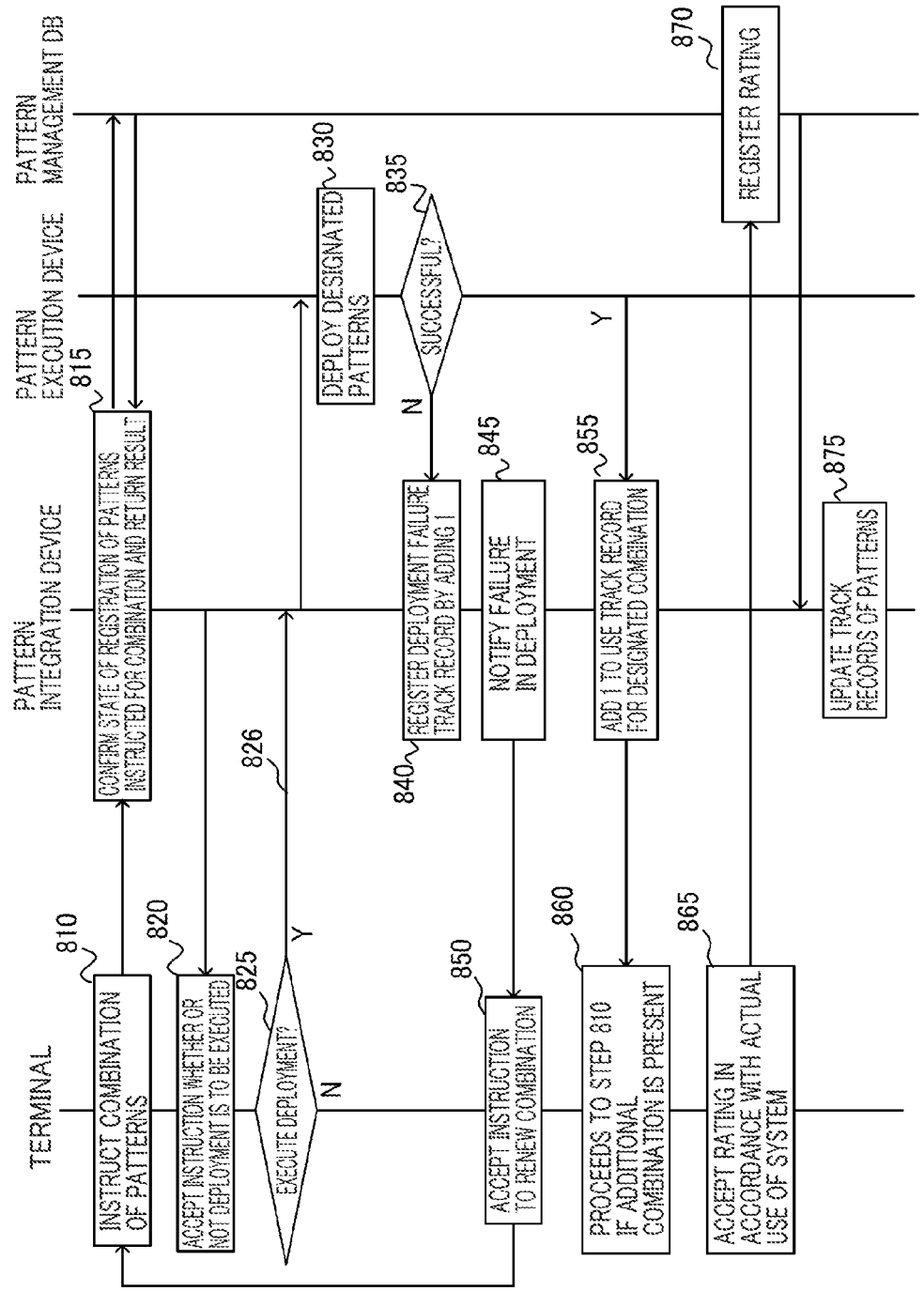
FIG. 11 is a flowchart showing a fourth procedural example of the system design supporting method of the first embodiment.

FIG. 11 is a flowchart showing a fourth procedural example of the system design supporting method of the first embodiment. Specifically, FIG. 11 is a flowchart showing the deployment of the patterns and a scheme to update the track records through the deployment. Here, it is assumed that, by using the terminal 190, the user 100 issues an instruction to install the IT system, which achieves the given requirements, by combining the patterns that are identified by the above-described search illustrated with the flow in FIG. 10 and are displayed on the terminal 190.

In this case, the terminal 190 accepts the instruction concerning the above-mentioned combination of the patterns, and transmits the instruction to the pattern integration device 140 of the system design support apparatus 180 (step 810). In this example, it is assumed that the terminal 190 displays the information on the patterns transmitted from the system design support apparatus 180 in step 625 and the like in the above-described flow in FIG. 10, as a list of the patterns on the given GUI. Moreover, it is assumed that the terminal 190 accepts a judgment and an instruction from the user 100 as to which pattern (e.g., the Web server) on the list of the patterns is to be coupled to which pattern (e.g., the DB server) thereon.

Meanwhile, the pattern integration device 140 confirms whether or not the combination of the patterns designated by the terminal 190 is actually suitably couplable, i.e., available, and returns a result of confirmation to the terminal 190 (step 815). In this processing, the pattern integration device 140 performs rating of each combination of patterns of an original element to be coupled and a counterpart element to be coupled which are designated by the terminal 190 while using the pattern combination list 410. In this rating, the pattern integration device 140 presumably performs judgment by selectively using any one of the expression 1500, the expression 1510, and the expression 1520 described above on the basis of a flag associated with the combination of the patterns, in order to evaluate an aptitude i.e., appropriateness of each combination of the patterns.

For example, regarding a combination of a "pattern A" concerning the "Web server" and a "pattern B" concerning the "DB server" in the pattern combination list 410, the pattern integration device 140 adopts the expression 1500 when no flags are provided to any of the patterns, and derives "0" which is a value of the track record of the pattern "short", i.e., "other." Likewise, regarding a combination of the "pattern A" concerning the "Web server" and a "pattern D" concerning the "DB server" in the pattern combination list 410, the pattern integration device 140 adopts the expression 1500 when no flags are provided to any of the patterns, and derives "0.5" which is a value of the track record of the pattern "bronze." Meanwhile, regarding a combination of a "pattern B" concerning the "Web server" and the "pattern D" concerning the "DB server" in the pattern combination list 410, if the "under_spec" flag is provided to the "pattern B", while the achievement standard of the requirement that is required concerning the "Web server" is set to "3", and the achievement standard of the requirement related to the "pattern B" is set to "5," then the pattern integration device 140 adopts the expression 1520 in accordance with the "under_spec" flag, and calculates the value of the track record of the pattern "gold" "1.3"−|3−5|/3=1.3−0.67=0.63. Meanwhile, regarding a combination of the "pattern B" concerning the "Web server" and the "pattern E" concerning the "DB server" in the pattern combination list 410, if the "under_spec" flag is provided to the "pattern B", while the achievement standard of the requirement that is required concerning the "Web server" is set to "3", and the achievement standard of the requirement related to the "pattern B" is set to "5," then the pattern integration device 140 adopts the expression 1520 in accordance with the "under_spec" flag, and calculates the value of the track record of the pattern "silver" "0.7"−|3−5|/3=0.7−0.67=0.03. The pattern integration device 140 identifies that any of the combinations of the patterns having the derived value equal to or above a predetermined reference value (e.g., 0.6) as being actually couplable, and returns a result of identification to the terminal 190. According to the above-described example, concerning the "Web server" and the "DB server," the pattern integration device 140 identifies that the combination of the "pattern B" and the "pattern D" as a preferred combination, and returns this information to the terminal 190. Here, the above-mentioned reference value is preferably equal or above 1.0, for example. However, the reference value may be set as appropriate depending on the intended use and the like of the IT system to be designed and installed.

Meanwhile, instead of performing the verification processing concerning the availability of the combinations of the patterns by using the expressions as described above, the availability may be evaluated only on the basis of the track records registered with the pattern combination list 410 concerning the corresponding combinations, i.e., on the values of gold=1.3, supported=1.0, silver=0.7, bronze=0.5, stone=0.2, excess=0.1, and other=0 (naturally, the availability is superior as the value is larger).

On the other hand, having received the result of confirmation concerning the availability regarding the combination of the designated patterns mentioned above from the pattern integration device 140, the terminal 190 displays the result of confirmation on the output device and accepts a final instruction from the user 100 as to whether or not the deployment is to be executed (step 820). Here, it is assumed that the user 100 judges to execute the deployment in accordance with the relevant combination of the patterns, and inputs the instruction as such by using the terminal 190.

In this case, the terminal 190 accepts the instruction to execute the deployment (step 825: Y), and notifies the pattern execution unit 150 of the instruction (step 826). Having received the notification via the pattern integration device 140, the pattern execution device 150 executes the deployment of the patterns designated by the terminal 190 on the cloud system 160 in accordance with a predetermined algorithm (procedures predetermined by a provider of the cloud service and the like) (step 830).

When the deployment is actually executed successfully without causing any problems such as occurrence of an error (step 835: Y), the pattern integration device 140 which receives a notification as such from the pattern execution device 150 counts up the value of the deployment success track record 475 for the corresponding record of the combination in the pattern combination table 470 (step 855). Meanwhile, if there is still another combination to be deployed, then the user 100 instructs as such by using the terminal 190 and the processing is executed again from the above-mentioned step 810 (step 860).

On the other hand, when the above-described pattern execution device 150 fails in the deployment processing on the cloud system 160 (step 835: N), the pattern integration device 140 which receives a notification as such from the pattern execution device 150 counts up the value of the deployment failure track record 476 for the corresponding record of the combination in the pattern combination table 470 (step 840), and notifies the terminal 190 of the failure in the deployment (step 845). Having received the notification, the terminal 190 displays the failure in the deployment concerning the corresponding combination of the patterns, accepts an instruction from the user 100 concerning a new combination (step 850), and returns the processing to the above-described step 810.

As a consequence of the series of the operations, the patterns corresponding to the requirements are deployed on the cloud system 160 and the system thus mounted is used by the above-mentioned user 100. Using the terminal 190, the user 100 inputs the rating determined in accordance with the use of the system. Meanwhile, the terminal 190 accepts the input of the rating (step 865), and registers the rating with the average rating 478 in the record for of corresponding combination in the pattern combination table 470 (step 870). The rating is registered on a ten-point scale, for example. Here, a case where the system is recommended as the best practice is rated 10. A case where the system can be used continuously without a change is rated 9. A case where it is possible to determine that there is an effect of patterning although changes in some items are involved is rated 7. A case where man-hours for designing are not substantially changed as a result of patterning but there is an effect as a whole such as in light of installation is rated 5. A case where overall man-hours are increased by contraries is rated 3. The above-mentioned allotment of rates may be changed depending on a system applying the rating. In conjunction with this change, the pattern integration device 140 may change the value of the application track record 477 in the pattern combination table 470 (step 875).

By using the system design supporting technique described above, the user 100 can reduce labor and cost for verification work concerning the combinations of the patterns by using the past track records in the situation where the multiple patterns are selected on the basis of multiple requirements.

Second Embodiment

The above-described first embodiment is applicable to both an on-premise system and a cloud system. Meanwhile, a case of performing a combination of patterns particularly in accordance with characteristics of a cloud system will be described below as a second embodiment. As described in the first embodiment, a cloud service is defined as a method in which a provider provides various resources such as hardware and software to be equipped on the cloud system 160 to a user as a service. Detailed specifications on a framework side of such a cloud service are not always disclosed to the user 100 side. In the meantime, specifications of the cloud services may be changed without being disclosed. Accordingly, on the assumption that the above-described patterns are deployed on the cloud system, it is also necessary to define a relationship between the patterns and the cloud service.

Figure 12:
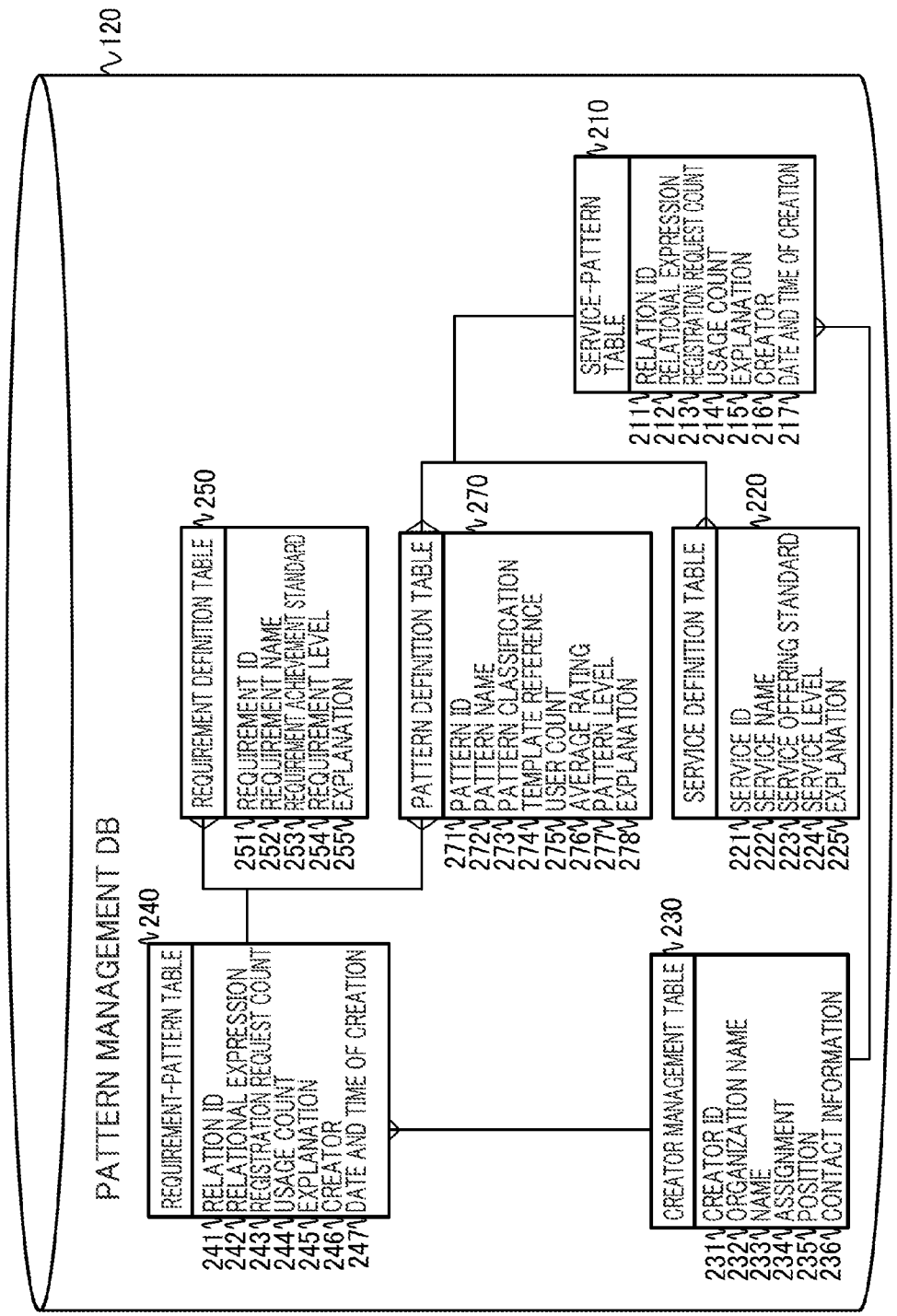
FIG. 12 is a diagram showing an example of tables included in a pattern management database of a second embodiment.

FIG. 12 is a diagram showing an example of tables included in the pattern management database 120 of the second embodiment. Specifically, FIG. 12 shows an example in which the pattern management database 120 manages information inclusive of relations between services and patterns.

The pattern management database 120 of the second embodiment further includes a service definition table 220 and a service-pattern table 210. Of the tables, the service definition table 220 is an aggregate of records, where each record uses a service ID 221 being an identifier unique to a cloud service as a key, and associates values of: a service name 222 indicating a defined name of the cloud service; a service offering standard 223 representing a benchmark to be offered as the cloud service; a service level 224 indicating relative offering standard strictness of the cloud service; and an explanation 225 indicating a specific explanation of the cloud service, with one another.

In the meantime, the service-pattern table 210 is an aggregate of records, where each record uses a relation ID 211 being a unique identifier representing a relation between each pattern defined in the pattern definition table 270 and each cloud service defined in the service definition table 220 as a key, and associates values of: a relational expression 212 indicating a relationship between the cloud service and the pattern; a registration request count 213 indicating how many times a registration request corresponding to the combination is issued from users; a usage count 214 indicating how many times the relationship is used; an explanation 215 which is a specific explanation of the relation; a creator 216 who is a creator of the relation; and date and time of creation 217 which is date and time when the relation is created, with one another.

Figure 13:
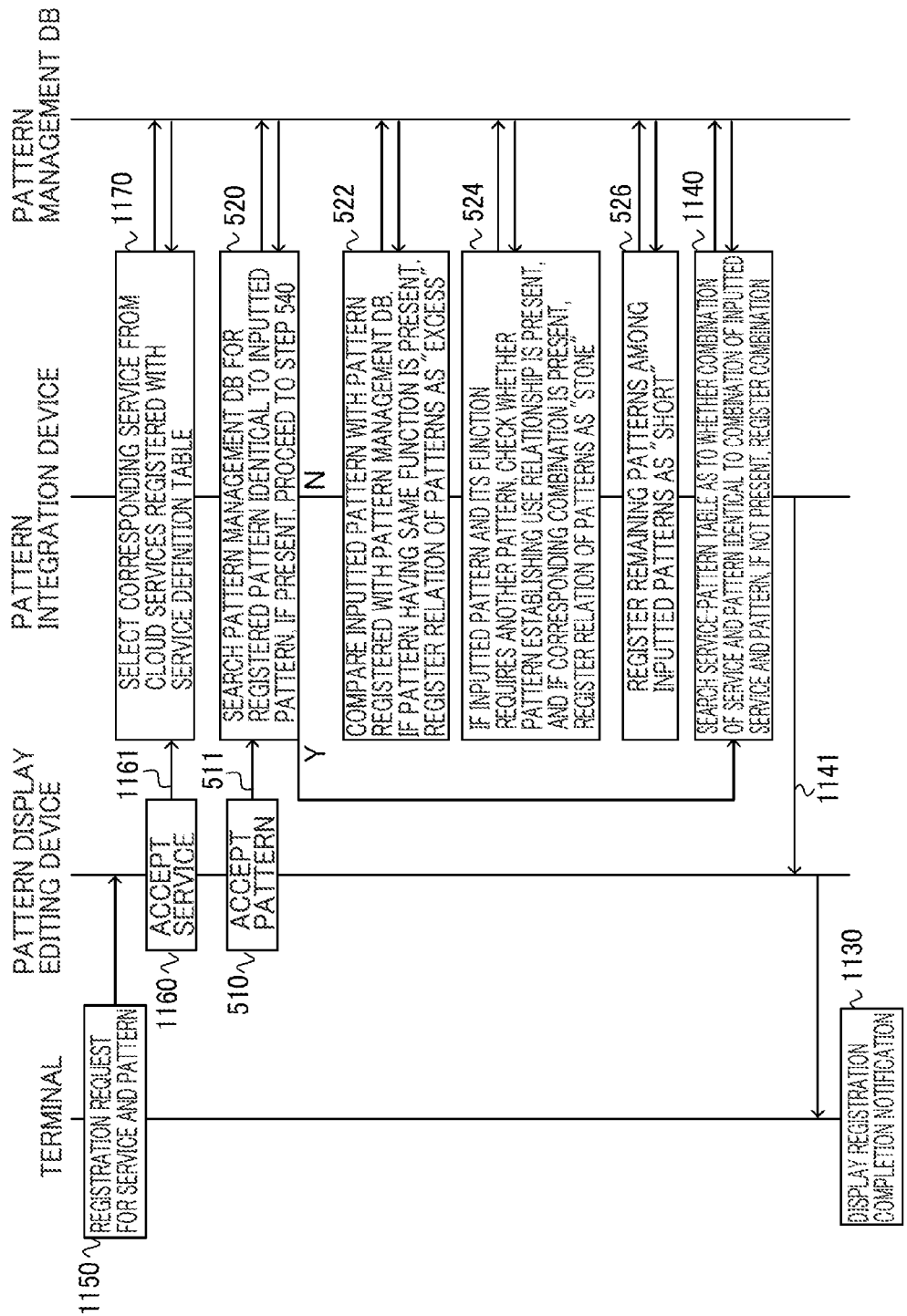
FIG. 13 is a flowchart showing a first procedural example of a system design supporting method of the second embodiment.

Subsequently, procedures of a system design supporting method to be executed by the system design support apparatus 180 of the second embodiment including the above-described pattern management database 120 will be described. FIG. 13 is a flowchart showing a first procedural example of the system design supporting method of the second embodiment. Specifically, FIG. 13 is a flowchart in the case of registration of the relation between the cloud service and the pattern.

Here, a situation is assumed in which the user 100 having enough knowledge about the cloud services performs registration of a pattern used for designing and installing a system with the pattern management database 120, inclusive of a relationship of the pattern with the cloud service as a deployment platform.

In this case, the terminal 190 accepts information concerning a set of the pattern and the cloud service inputted by the above-mentioned user 100, and transmits the information to the system design support apparatus 180 together with a registration request (step 1150).

Meanwhile, the pattern display editing device 110 of the system design support apparatus 180 accepts the information on the pattern and the cloud service indicated in the above-mentioned registration request (steps 1160, 510) via the appropriate interfaces and the like provided to the terminal 190, and notifies the pattern integration device 140 of the pattern and the cloud service (steps 1161, 511).

In this case, the pattern integration device 140 executes a search in the service definition table 220 by using the information on the cloud service notified from the above-mentioned pattern display editing device 110 (e.g., the information such as the ID and the name of the cloud service designated by the user 100) as a key. Thus, among the cloud services registered with the service definition table 220, the pattern integration device 140 selects a cloud service having the values of the corresponding items in the service ID 221 and the service name 222 which coincide with the above-mentioned search key (step 1170). Here, each of the cloud services is assumed to be registered in advance with the service definition table 220 of the pattern management database 120.

The contents of the processing in steps 510 to 526 in FIG. 13 are the same as those in the flow of the pattern registration in FIG. 5. Accordingly, the descriptions of these steps are omitted herein.

Next, in step 1140, the pattern integration device 140 searches the service-pattern table 210 for the combination of the cloud service selected in the above-described step 1170 and the corresponding pattern (which undergoes the processing in steps 520 to 526). If the identical combination is not registered yet, the pattern integration device 140 executes the registration (step 1140).

After completion of the above-described series of processing, the pattern integration device 140 returns a registration completion notification to the terminal 190 (step 1141). In the meantime, the terminal 190 receives this registration completion notification and displays the registration completion notification on the display device (step 1130), and then terminates the processing.

Figure 14:
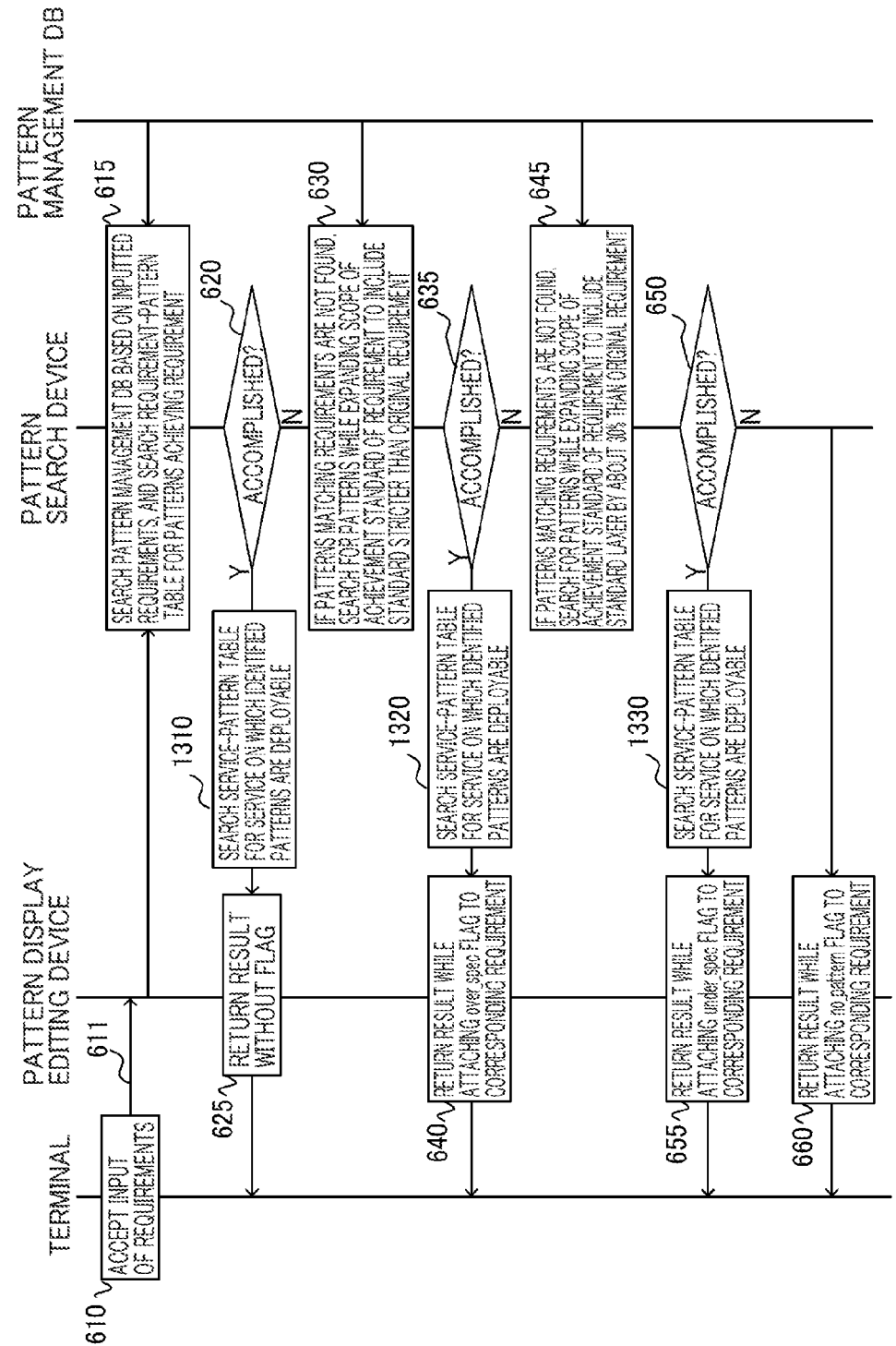
FIG. 14 is a flowchart showing a second procedural example of the system design supporting method of the second embodiment.

Next, details of processing for selecting a pattern in response to an input of a requirement in the second embodiment will be described. FIG. 14 is a flowchart showing a second procedural example of the system design supporting method of the second embodiment. Specifically, FIG. 14 shows a flowchart in the case of selecting a pattern on requirements of the IT system to be newly designed and installed after the combination of the cloud service and the pattern has been registered as described above.

In the flow shown as an example in FIG. 14, the steps from the search for the pattern using the requirement to the identification of the pattern are the same as those in the flow of FIG. 10. However, the steps in which the pattern search device 130 searches the service-pattern table 210 for the cloud service on which the identified pattern is deployable and notifies the terminal 190 of the searched cloud service via the pattern display editing device 110 are adapted to the second embodiment and are different from those in the flow of FIG. 10 in the first embodiment (steps 1310, 1320, 1330).

By executing steps 1310, 1320, and 1330, the user 100 operating the terminal 190 can clearly and easily recognize on which cloud service the patterns for the IT system that the user 100 intends to design and install are deployable. For this reason, this embodiment also provides an effect that it is easier to perform arbitrary selection of infrastructure, i.e., selection of the cloud service on the basis of an appropriate condition such as a security policy of an organization to which the user 100 belongs.

Note that the processing associated with the deployment in the second embodiment is the same as the processing described on the basis of FIG. 11 in the first embodiment. Accordingly, the descriptions of the processing will be omitted.

Although the best modes for carrying out the present invention and the like have been specifically described above, the present invention is not limited only to the foregoing and various modifications are possible within a range not departing from the scope of the invention.

According to the above-described embodiments, in a situation of system development based on patterns on cloud services, for example, it is possible to avoid a situation where a pattern matching a system requirement requested by a customer cannot be found, or in contrast, a situation where too many patterns matching the requirement are found and it is therefore uncertain which one should be selected. Furthermore, it is possible to effectively reduce man-hours for retesting and redesigning by humans concerning installed systems.

In other words, the present invention can propose a combination of system installation elements, which complies with multiple requirements concerning a system to be installed and enables efficient system design and installation.

The descriptions of the specification clarify at least the following features. Specifically, a system design support apparatus according to any of the embodiments may be designed such that: the storage device is configured to store the first table in which each of the design information elements on the system designed in the past, the requirement achieved by the design information element, and a use track record of the design information element are stored in association with each other, and during processing to identify the first design information elements achieving the plurality of requirements, the processing unit identifies the first design information element achieving each of the plurality of requirements on the basis of a magnitude of the use track record, by using the first table in the storage device.

According to the above-described features, it is possible to propose to the user the design information element having a high use track record among the design information elements complying with the requirement, i.e., the design information element which has been used many times and proven to be capable of installing and operating the system that satisfies the requirement, without causing any problems.

Meanwhile, the system design support apparatus according to any of the embodiments may be designed such that: as a consequence of the processing to identify the first design information elements each achieving the corresponding one of the plurality of requirements, if, for a third requirement among the plurality of requirements, the processing unit fails to identify the first design information element achieving the third requirement and having the use track record equal to or above a predetermined standard, the processing unit further executes processing to modify a definition indicated in the third requirement within a predetermined range to establish a fourth requirement, and identify a first design information element achieving the fourth requirement and having the use track record equal to or above the predetermined standard, by using the first table.

According to the above-described features, it is possible to select and propose the design information element which satisfies the requirement loosened to the extent that does not cause a practical problem, and thus to achieve more realistic and efficient system design and installation.

In the meantime, the system design support apparatus according to any of the embodiments may be designed such that: in the second table, the storage device manages the aptitudes of the combined use of the plurality of the design information elements included in the first table with the aptitude ranks each assigned by using, as the track record of the combined use, information on a degree of change in any of the design information elements required due to the combined use, and during processing to identify the first design information element establishing the combination at the higher aptitude rank among the plurality of the first design information elements, the processing unit refers, in the second table in the storage device, to the aptitude rank of the combined use of each of the plurality of the first design information elements and any of the design information elements identified for the second requirement among the plurality of requirements, eliminates a first design information element establishing the combination which has the aptitude rank equal to or below a predetermined standard and which involves the degree of change in the design information elements outside an allowable range, and identifies the first design information element establishing the combination at the higher aptitude among the plurality of the first design information elements.

According to the above-described features, it is possible to take into account a case where the combined use of the design information elements, which did not have any problem in light of the aptitude for the requirement, has in fact incurred significant additional man-hours in an attempt of a deployment on an actual system for operation. Hence, it is possible to perform selection after eliminating in advance the combination of the design information pieces which has a practical problem. In this case, the user can recognize the appropriate design information elements for the system design and properly use the design information elements without being misled by a superficial aptitude for the requirement.

Meanwhile, the system design support apparatus according to any of the embodiments may be designed such that: in the second table, the storage device manages the aptitudes of the combined use of the plurality of the design information elements included in the first table with the aptitude ranks each assigned by using, as the track record of the combined use, information on a degree of change in any of the design information elements required due to the combined use, and during processing to identify the first design information element establishing the combination at the higher aptitude rank among the plurality of the first design information elements, the processing unit refers, in the second table in the storage device, to the aptitude rank of the combined use of each of the plurality of the first design information elements and any of the design information elements identified for the second requirement among the plurality of requirements, and if the processing unit fails to identify the first design information element establishing the combination at the aptitude rank equal to or higher than a predetermined rank among the plurality of the first design information elements, identifies the first design information element establishing the combination at the higher aptitude rank among a plurality of first design information elements each establishing another combination which has the aptitude rank within a predetermined range lower than the predetermined rank and which involves the degree of change in the design information elements within an allowable range, and during processing to output the identified design information elements to the predetermined device, the processing unit further outputs information indicating that an additional design information element is required for using the design information elements identified as establishing the other combination.

According to the above-described features, it is possible to take into account a case where the combined use of the design information elements, which did not have any problem in light of the aptitude for the requirement, has in fact incurred additional man-hours in an attempt of a deployment on an actual system for operation to the extent tolerable relative to an effect of improvement in efficiency which can be obtained by reusing the design information elements. Hence, it is possible to propose to the user the combination of the design information elements that promises a certain level of improvement in efficiency although the combination are likely to require some additional man-hours. In this case, the user can recognize the design information elements that promise a certain level of improvement under a situation where it is not possible to obtain the design information elements with the aptitude as well as the use track record at the top level, and properly use the design information elements.

In the meantime, the system design support apparatus according to any of the embodiments may be designed such that: during processing to identify the first design information element establishing the combination at the higher aptitude rank among the plurality of the first design information elements, the processing unit refers to, in the second table in the storage device, the aptitude rank of the combined use of each of the plurality of the first design information elements and any of the design information elements identified for the second requirement among the plurality of requirements, and if the processing unit fails to identify the first design information element establishing the combination at the aptitude rank equal to or higher than a predetermined rank among the plurality of the first design information elements, identifies the first design information element establishing the combination at the higher aptitude rank among a plurality of the first design information elements each establishing another combination which has the aptitude rank within a predetermined range lower than the predetermined rank and which has a track record of the combined use equal to or below a predetermined standard, and during processing to output the identified design information elements to the predetermined device, the processing unit further outputs information indicating that a verification operation is required for using the design information elements identified to establish the other combination.

According to the above-described features, it is possible to take into account a case where the combination of the design information elements, which did not have any problem in light of the aptitude for the requirement, has in fact been used only infrequently. Hence, it is possible to propose to the user the combination of the design information elements that promises a certain level of improvement in efficiency although its practical reliability is insufficient. In this case, the user can recognize the design information elements that promise a certain level of improvement albeit not with perfect reliability under a situation where it is not possible to obtain the design information elements with the aptitude as well as the use track record at the top level, and properly use the design information elements.

Meanwhile, the system design support apparatus according to any of the embodiments may be designed such that: during the processing to identify the first design information element establishing the combination at the higher aptitude rank among the plurality of the first design information elements, the processing unit refers to the aptitude rank of the combined use of each of the plurality of the first design information elements and any of the design information elements identified for the second requirement among the plurality of requirements, by using the second table in the storage device, and if the processing unit fails to identify the first design information element establishing the combination at the aptitude rank equal to or higher than a predetermined rank among the plurality of the first design information elements, identifies a first design information element establishing still another combination which has the aptitude rank within a predetermined range lower than the predetermined rank and which has no track record of the combined use.

According to the above-described features, it is possible to take into account a case where the combination of the design information elements, which did not have any problem in light of the aptitude for the requirement, has in fact never been used. Hence, it is possible to propose to the user the combination of the design information elements that promises a certain level of improvement in efficiency although it is necessary to conduct a given verification operation. In this case, the user can recognize the design information elements that promise a certain level of improvement albeit requiring the verification operation under a situation where it is not possible to obtain the design information elements with the aptitude as well as the use track record at the top level, and properly use the design information elements.

In the meantime, the system design support apparatus according to any of the embodiments may be designed such that: the processing unit further executes processing to create a configuration deployable on a cloud service on the basis of the design information elements identified for the plurality of requirements, and to deploy the created deployable configuration on the cloud service.

According to the above-described features, in a situation where the design information elements are provided from the cloud service, it is possible to deploy the design information elements identified as described above on the cloud service, thus installing the system to be designed.

Meanwhile, the system design support apparatus according to any of the embodiments may be designed such that: the storage device further store a third table that stores information elements on cloud services on which the design information elements included in the first table are deployable, and during processing to output the identified design information elements to the predetermined device, the processing unit identifies an information element on a cloud service on which each of the identified design information elements is deployable, by using the third table, and further outputs the identified information element on the cloud service on which each of the identified design information elements is deployable.

According to the above-described features, the user can easily recognize on which cloud service the design information elements identified as described above are deployable. Thus, the user can arbitrarily select the cloud service on the basis of a desired condition out of the cloud services on which the design information elements are deployable. Hence, the freedom, usability, and the like of design work are improved.

Meanwhile, a system design supporting method according to any of the embodiments may be designed such that: the information processing apparatus stores, in the first table of the storage device, each of the design information elements on the system designed in the past in the first table, the requirement achieved by the design information element, and a use track record of the design information element while associating the design information element, the requirement and the use track record with each other, and during processing to identify the first design information elements achieving the plurality of requirements, identifies the first design information element achieving each of the plurality of requirements on the basis of a magnitude of the use track record, by using the first table in the storage device.

Meanwhile, the system design supporting method according to any of the embodiments may be designed such that: as a consequence of the processing to identify the first design information elements achieving the plurality of requirements, if, for a third requirement among the plurality of requirements the information processing apparatus fails to identify the first design information element achieving the third requirement and having the use track record equal to or above a predetermined standard, the information processing apparatus further executes processing to modify a definition indicated in the third requirement within a predetermined range to establish a fourth requirement, and identify the first design information element achieving the fourth requirement and having the use track record equal to or above the predetermined standard, by using the first table.

In the meantime, the system design supporting method according to any of the embodiments may be designed such that: the information processing apparatus manages, in the second table in the storage device, the aptitudes of the combined use of the plurality of the design information elements included in the first table with the aptitude ranks each assigned by using, as the track record of the combined use, information on a degree of change in any of the design information elements required due to the combined use, and during processing to identify the first design information element establishing the combination at the higher aptitude rank among the plurality of the first design information elements, refers, in the second table in the storage device, to the aptitude rank of the combined use of each of the plurality of the first design information elements and any of the design information elements identified for the second requirement among the plurality of requirements, eliminates a first design information element establishing the combination which has the aptitude rank equal to or below a predetermined standard and which involves the degree of change in the design information elements outside an allowable range, and identifies the first design information element establishing the combination at the higher aptitude among the plurality of the first design information elements.

Meanwhile, the system design supporting method according to any of the embodiments may be designed such that: the information processing apparatus manages, in the second table in the storage device, the aptitudes of the combined use of the plurality of the design information elements included in the first table with the aptitude ranks each assigned by using, as the track record of the combined use, information on a degree of change in any of the design information elements required due to the combined use, and during processing to identify the first design information element establishing the combination at the higher aptitude rank among the plurality of the first design information elements, refers, in the second table in the storage device, to the aptitude rank of the combined use of each of the plurality of the first design information elements and any of the design information elements identified for the second requirement among the plurality of requirements, if the processing unit fails to identify the first design information element establishing the combination at the aptitude rank equal to or higher than a predetermined rank among the plurality of the first design information elements, identifies the first design information element establishing the combination which has the higher aptitude rank among the plurality of the first design information elements each establishing another combination at the aptitude rank within a predetermined range lower than the predetermined rank and which involves the degree of change in the design information elements within an allowable range, and during processing to output the identified design information elements to the predetermined device, further outputs information indicating that an additional design information element is required for using the design information elements identified to establish the other combination.

In the meantime, the system design supporting method according to any of the embodiments may be designed such that: during processing to identify the first design information element establishing the combination at the higher aptitude rank among the plurality of the first design information elements, the information processing apparatus refers to the aptitude rank of the combined use of each of the plurality of the first design information elements and any of the design information elements identified for the second requirement among the plurality of requirements, by using the second table in the storage device, if the information processing apparatus fails to identify the first design information element establishing the combination at the aptitude rank equal to or higher than a predetermined rank among the plurality of the first design information elements, identifies the first design information element establishing the combination at the higher aptitude rank among a plurality of the first design information elements each establishing another combination which has the aptitude rank within a predetermined range lower than the predetermined rank and which has a track record of the combined use equal to or below a predetermined standard, and during processing to output the identified design information elements to the predetermined device, further outputs information indicating that a verification operation is required for using the design information elements identified as establishing the other combination.

Meanwhile, the system design supporting method according to any of the embodiments may be designed such that: during the processing to identify the first design information element establishing the combination at the higher aptitude rank among the plurality of the first design information elements, the information processing apparatus refers, in the second table in the storage device, to the aptitude rank of the combined use of each of the plurality of the first design information elements and any of the design information elements identified for the second requirement among the plurality of requirements, and if the information processing apparatus fails to identify the first design information element establishing the combination at the aptitude rank equal to or higher than a predetermined rank among the plurality of the first design information elements, identifies the first design information elements each establishing still another combination which has the aptitude rank within a predetermined range lower than the predetermined rank and which has no track record of the combined use.

In the meantime, the system design supporting method according to any of the embodiments may be designed such that: the information processing apparatus further executes processing to create a configuration deployable on a cloud service on the basis of the design information elements identified for the plurality of requirements, and to deploy the created deployable configuration on the cloud service.

Meanwhile, the system design supporting method according to any of the embodiments may be designed such that: the information processing apparatus causes the storage device to further store a third table that stores information elements on cloud services on which the design information elements included in the first table are deployable, and during processing to output the identified design information elements to the predetermined device, identifies an information element on a cloud service on which each of the identified design information elements is deployable, by using the third table, and further outputs the identified information element on the cloud service on which each of the identified design information elements is deployable.

What is claimed is:

1. A system design support apparatus comprising:
   a storage device configured to store
      a first table in which design information elements of a system designed in the past and requirements to be achieved by the design information elements are stored in association with one another, and
      a second table in which aptitudes of combined use of a plurality of the design information elements included in the first table are managed with aptitude ranks assigned on the basis of track records of the combined use; and
   a processing unit configured
      to identify first design information elements achieving a plurality of requirements concerning a system to be newly designed, by using the first table in the storage device,
      when a plurality of the first design information elements are identified for a first requirement among the plurality of requirements as a result of the identification, to refer, in the second table in the storage device, to the aptitude rank of combined use of each of the plurality of the first design information elements and a design information element identified for a second requirement different from the first requirement among the plurality of requirements, and thereby to identify the first design information element establishing a combination at a higher aptitude rank among the plurality of the first design information elements, and
      to output the first design information elements thus identified for the plurality of requirements to a predetermined device.

2. The system design support apparatus according to claim 1, wherein
   the storage device is configured to store the first table in which each of the design information elements on the system designed in the past, the requirement achieved by the design information element, and a use track record of the design information element are stored in association with each other, and
   during processing to identify the first design information elements achieving the plurality of requirements, the processing unit identifies the first design information element achieving each of the plurality of requirements on the basis of a magnitude of the use track record, by using the first table in the storage device.

3. The system design support apparatus according to claim 2, wherein, as a consequence of the processing to identify the first design information elements each achieving the corresponding one of the plurality of requirements, if, for a third requirement among the plurality of requirements, the processing unit fails to identify the first design information element achieving the third requirement and having the use track record equal to or above a predetermined standard,
   the processing unit further executes processing to
      modify a definition indicated in the third requirement within a predetermined range to establish a fourth requirement, and
      identify a first design information element achieving the fourth requirement and having the use track record equal to or above the predetermined standard, by using the first table.

4. The system design support apparatus according to claim 1, wherein
   in the second table, the storage device manages the aptitudes of the combined use of the plurality of the design information elements included in the first table with the aptitude ranks each assigned by using, as the track record of the combined use, information on a degree of change in any of the design information elements required due to the combined use, and
   during processing to identify the first design information element establishing the combination at the higher aptitude rank among the plurality of the first design information elements,
   the processing unit
      refers, in the second table in the storage device, to the aptitude rank of the combined use of each of the plurality of the first design information elements and any of the design information elements identified for the second requirement among the plurality of requirements,
      eliminates a first design information element establishing the combination which has the aptitude rank equal to or below a predetermined standard and which involves the degree of change in the design information elements outside an allowable range, and identifies the first design information element establishing the combination at the higher aptitude among the plurality of the first design information elements.

5. The system design support apparatus according to claim 1, wherein
in the second table, the storage device manages the aptitudes of the combined use of the plurality of the design information elements included in the first table with the aptitude ranks each assigned by using, as the track record of the combined use, information on a degree of change in any of the design information elements required due to the combined use, and
during processing to identify the first design information element establishing the combination at the higher aptitude rank among the plurality of the first design information elements,
the processing unit refers, in the second table in the storage device, to the aptitude rank of the combined use of each of the plurality of the first design information elements and any of the design information elements identified for the second requirement among the plurality of requirements, and
if the processing unit fails to identify the first design information element establishing the combination at the aptitude rank equal to or higher than a predetermined rank among the plurality of the first design information elements, identifies the first design information element establishing the combination at the higher aptitude rank among a plurality of first design information elements each establishing another combination which has the aptitude rank within a predetermined range lower than the predetermined rank and which involves the degree of change in the design information elements within an allowable range, and
during processing to output the identified design information elements to the predetermined device, the processing unit further outputs information indicating that an additional design information element is required for using the design information elements identified as establishing the other combination.

6. The system design support apparatus according to claim 1, wherein, during processing to identify the first design information element establishing the combination at the higher aptitude rank among the plurality of the first design information elements,
the processing unit refers to, in the second table in the storage device, the aptitude rank of the combined use of each of the plurality of the first design information elements and any of the design information elements identified for the second requirement among the plurality of requirements, and
if the processing unit fails to identify the first design information element establishing the combination at the aptitude rank equal to or higher than a predetermined rank among the plurality of the first design information elements, identifies the first design information element establishing the combination at the higher aptitude rank among a plurality of the first design information elements each establishing another combination which has the aptitude rank within a predetermined range lower than the predetermined rank and which has a track record of the combined use equal to or below a predetermined standard, and
during processing to output the identified design information elements to the predetermined device, the processing unit further outputs information indicating that a verification operation is required for using the design information elements identified to establish the other combination.

7. The system design support apparatus according to claim 6, wherein, during the processing to identify the first design information element establishing the combination at the higher aptitude rank among the plurality of the first design information elements, the processing unit
refers to the aptitude rank of the combined use of each of the plurality of the first design information elements and any of the design information elements identified for the second requirement among the plurality of requirements, by using the second table in the storage device, and
if the processing unit fails to identify the first design information element establishing the combination at the aptitude rank equal to or higher than a predetermined rank among the plurality of the first design information elements, identifies a first design information element establishing still another combination which has the aptitude rank within a predetermined range lower than the predetermined rank and which has no track record of the combined use.

8. The system design support apparatus according to claim 1, wherein the processing unit further executes processing
to create a configuration deployable on a cloud service on the basis of the design information elements identified for the plurality of requirements, and
to deploy the created deployable configuration on the cloud service.

9. The system design support apparatus according to claim 8, wherein
the storage device further stores a third table that stores information elements on cloud services on which the design information elements included in the first table are deployable, and
during processing to output the identified design information elements to the predetermined device,
the processing unit
identifies an information element on a cloud service on which each of the identified design information elements is deployable, by using the third table, and
further outputs the identified information element on the cloud service on which each of the identified design information elements is deployable.

10. A system design supporting method to be executed by an information processing apparatus provided with
a storage device configured to store
a first table in which design information elements on a system designed in the past and requirements to be achieved by the design information elements are stored in association with one another, and
a second table in which aptitudes of combined use of a plurality of the design information elements included in the first table are managed with aptitude ranks assigned on the basis of track records of the combined use,
the method comprising:
identifying first design information elements achieving a plurality of requirements concerning a system to be newly designed, by using the first table in the storage device;
when a plurality of the first design information elements are identified for a first requirement among the plurality of requirements as a result of the identification, referring, in the second table in the storage device, to an aptitude rank of combined use of each of the plurality of the first design information elements and any of the design information elements identified for a second requirement different from the first requirement among the plurality of requirements, and thereby identifying the first design information element establishing a combination at a higher aptitude rank among the plurality of the first design information elements; and outputting the first design information elements, identified for each of the plurality of requirements to a predetermined device.

11. The system design supporting method according to claim 10, wherein the information processing apparatus stores, in the first table of the storage device, each of the design information elements on the system designed in the past in the first table, the requirement achieved by the design information element, and a use track record of the design information element while associating the design information element, the requirement and the use track record with each other, and during processing to identify the first design information elements achieving the plurality of requirements, identifies the first design information element achieving each of the plurality of requirements on the basis of a magnitude of the use track record, by using the first table in the storage device.

12. The system design supporting method according to claim 11, wherein, as a consequence of the processing to identify the first design information elements achieving the plurality of requirements, if, for a third requirement among the plurality of requirements the information processing apparatus fails to identify the first design information element achieving the third requirement and having the use track record equal to or above a predetermined standard, the information processing apparatus further executes processing to modify a definition indicated in the third requirement within a predetermined range to establish a fourth requirement, and identify the first design information element achieving the fourth requirement and having the use track record equal to or above the predetermined standard, by using the first table.

13. The system design supporting method according to claim 10, wherein the information processing apparatus manages, in the second table in the storage device, the aptitudes of the combined use of the plurality of the design information elements included in the first table with the aptitude ranks each assigned by using, as the track record of the combined use, information on a degree of change in any of the design information elements required due to the combined use, and during processing to identify the first design information element establishing the combination at the higher aptitude rank among the plurality of the first design information elements, refers, in the second table in the storage device, to the aptitude rank of the combined use of each of the plurality of the first design information elements and any of the design information elements identified for the second requirement among the plurality of requirements, eliminates a first design information element establishing the combination which has the aptitude rank equal to or below a predetermined standard and which involves the degree of change in the design information elements outside an allowable range, and identifies the first design information element establishing the combination at the higher aptitude among the plurality of the first design information elements.

14. The system design supporting method according to claim 10, wherein the information processing apparatus manages, in the second table in the storage device, the aptitudes of the combined use of the plurality of the design information elements included in the first table with the aptitude ranks each assigned by using, as the track record of the combined use, information on a degree of change in any of the design information elements required due to the combined use, and during processing to identify the first design information element establishing the combination at the higher aptitude rank among the plurality of the first design information elements, refers, in the second table in the storage device, to the aptitude rank of the combined use of each of the plurality of the first design information elements and any of the design information elements identified for the second requirement among the plurality of requirements, if the processing unit fails to identify the first design information element establishing the combination at the aptitude rank equal to or higher than a predetermined rank among the plurality of the first design information elements, identifies the first design information element establishing the combination which has the higher aptitude rank among the plurality of the first design information elements each establishing another combination at the aptitude rank within a predetermined range lower than the predetermined rank and which involves the degree of change in the design information elements within an allowable range, and during processing to output the identified design information elements to the predetermined device, further outputs information indicating that an additional design information element is required for using the design information elements identified to establish the other combination.

15. The system design supporting method according to claim 10, wherein, during processing to identify the first design information element establishing the combination at the higher aptitude rank among the plurality of the first design information elements, the information processing apparatus refers to the aptitude rank of the combined use of each of the plurality of the first design information elements and any of the design information elements identified for the second requirement among the plurality of requirements, by using the second table in the storage device, if the information processing apparatus fails to identify the first design information element establishing the combination at the aptitude rank equal to or higher than a predetermined rank among the plurality of the first design information elements, identifies the first design information element establishing the combination at the higher aptitude rank among a plurality of the first design information elements each establishing another combination which has the aptitude rank within a predetermined range lower than the predetermined rank and which has a track record of the combined use equal to or below a predetermined standard, and during processing to output the identified design information elements to the predetermined device, further outputs information indicating that a verification operation is required for using the design information elements identified as establishing the other combination.

16. The system design supporting method according to claim 15, wherein, during the processing to identify the first design information element establishing the combination at the higher aptitude rank among the plurality of the first design information elements, the information processing apparatus refers, in the second table in the storage device, to the aptitude rank of the combined use of each of the plurality of the first design information elements and any of the design information elements identified for the second requirement among the plurality of requirements, and if the information processing apparatus fails to identify the first design information element establishing the combination at the aptitude rank equal to or higher than a predetermined rank among the plurality of the first design information elements, identifies the first design information elements each establishing still another combination which has the aptitude rank within a predetermined range lower than the predetermined rank and which has no track record of the combined use.

17. The system design supporting method according to claim 10, wherein the information processing apparatus further executes processing to create a configuration deployable on a cloud service on the basis of the design information elements identified for the plurality of requirements, and to deploy the created deployable configuration on the cloud service.

18. The system design supporting method according to claim 17, wherein the information processing apparatus causes the storage device to further store a third table that stores information elements on cloud services on which the design information elements included in the first table are deployable, and during processing to output the identified design information elements to the predetermined device, identifies an information element on a cloud service on which each of the identified design information elements is deployable, by using the third table, and further outputs the identified information element on the cloud service on which each of the identified design information elements is deployable.

* * * * *